United States Patent
Koike

(10) Patent No.: US 8,314,470 B2
(45) Date of Patent: Nov. 20, 2012

(54) SOLID-STATE IMAGING DEVICE AND MANUFACTURING METHOD THEREOF

(75) Inventor: Hidetoshi Koike, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 12/908,919

(22) Filed: Oct. 21, 2010

(65) Prior Publication Data
US 2011/0079868 A1    Apr. 7, 2011

Related U.S. Application Data

(63) Continuation of application No. PCT/JP2009/052359, filed on Feb. 5, 2009.

(30) Foreign Application Priority Data

Apr. 21, 2008    (JP) ................. 2008-110642

(51) Int. Cl.
*H01L 31/0232*    (2006.01)
(52) U.S. Cl. ................ 257/432; 257/414; 257/E31.127; 438/69; 438/22
(58) Field of Classification Search .................. 257/432, 257/414, E31.127; 438/69, 22
See application file for complete search history.

(56) References Cited

U.S. PATENT DOCUMENTS
2007/0153108 A1    7/2007    Ihara

FOREIGN PATENT DOCUMENTS
| EP | 1 533 847 A1 | 5/2005 |
| JP | 2003-60192 | 2/2003 |
| JP | 2004-31677 | 1/2004 |
| JP | 2006-41196 A | 2/2006 |
| JP | 2007-184368 | 7/2007 |

OTHER PUBLICATIONS

Office Action issued Feb. 22, 2011, in Japan Patent Application No. 2008-110642 (with English translation).

*Primary Examiner* — Telly Green
(74) *Attorney, Agent, or Firm* — Oblon, Spivak, McClelland, Maier & Neustadt, L.L.P.

(57) ABSTRACT

According to one embodiment, a solid-state imaging device includes a semiconductor substrate of a first conductive type having a diffusion layer region provided on a surface thereof, a diffusion layer of the first conductive type for a pixel separation whose bottom portion is formed at the deepest position of the diffusion layer region in a pixel region, and a first deep diffusion layer of the first conductive type provided at the deepest position of the diffusion layer region in a first peripheral logic region for electrically connecting the semiconductor substrate and the first peripheral logic region and having a first concentration gradient equal to that of the diffusion layer for pixel separation.

20 Claims, 25 Drawing Sheets

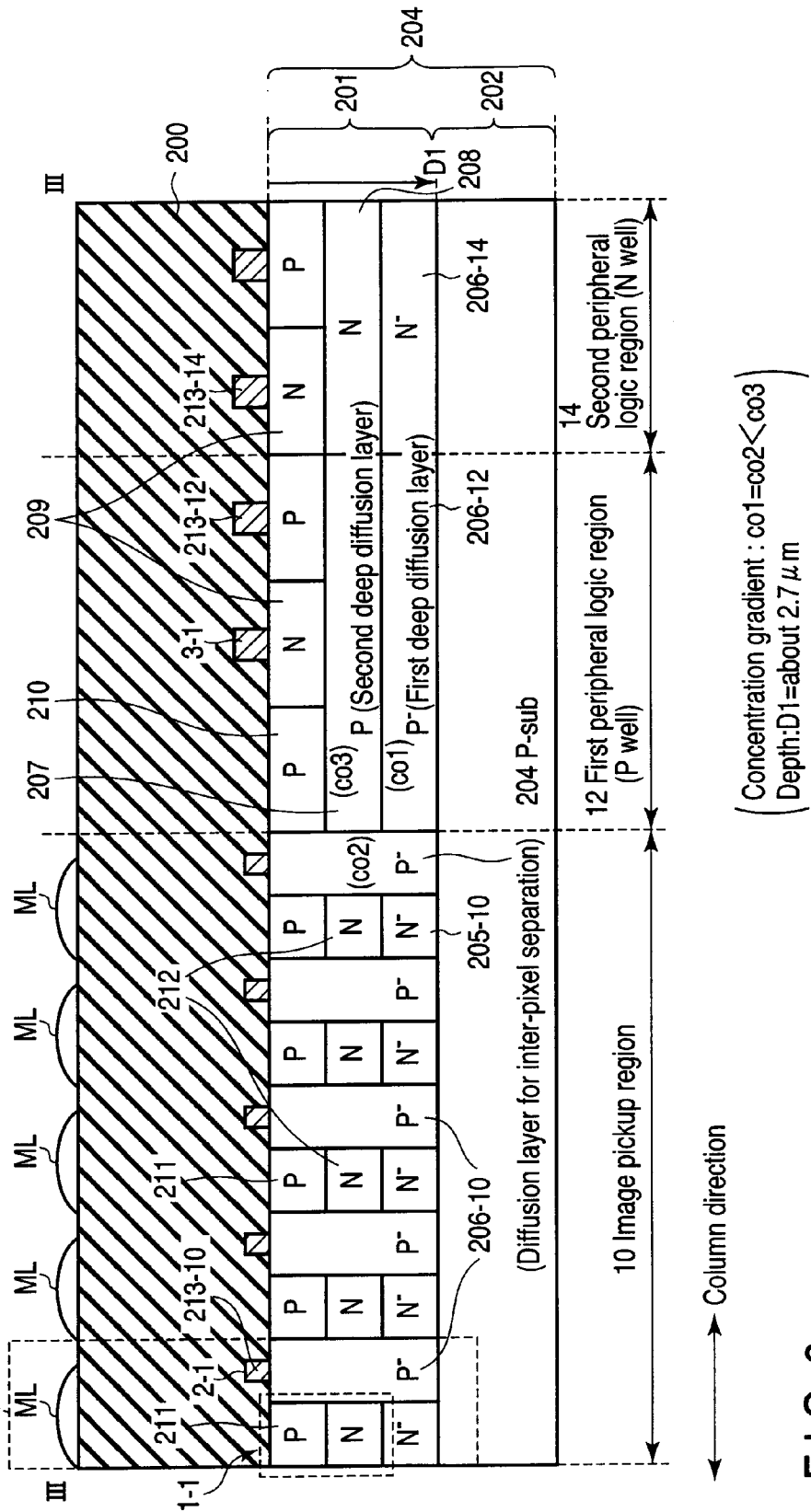
F I G. 3

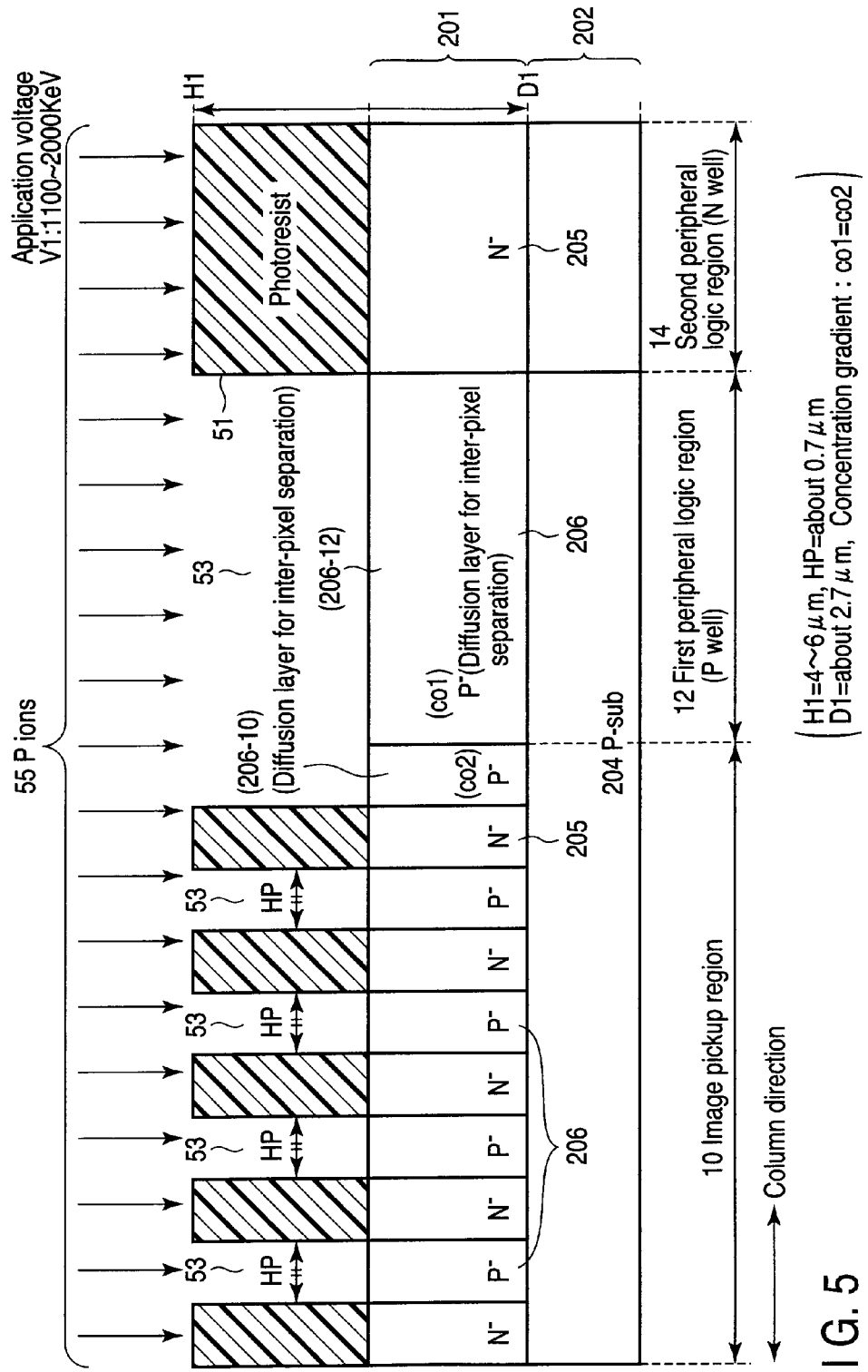
F I G. 5

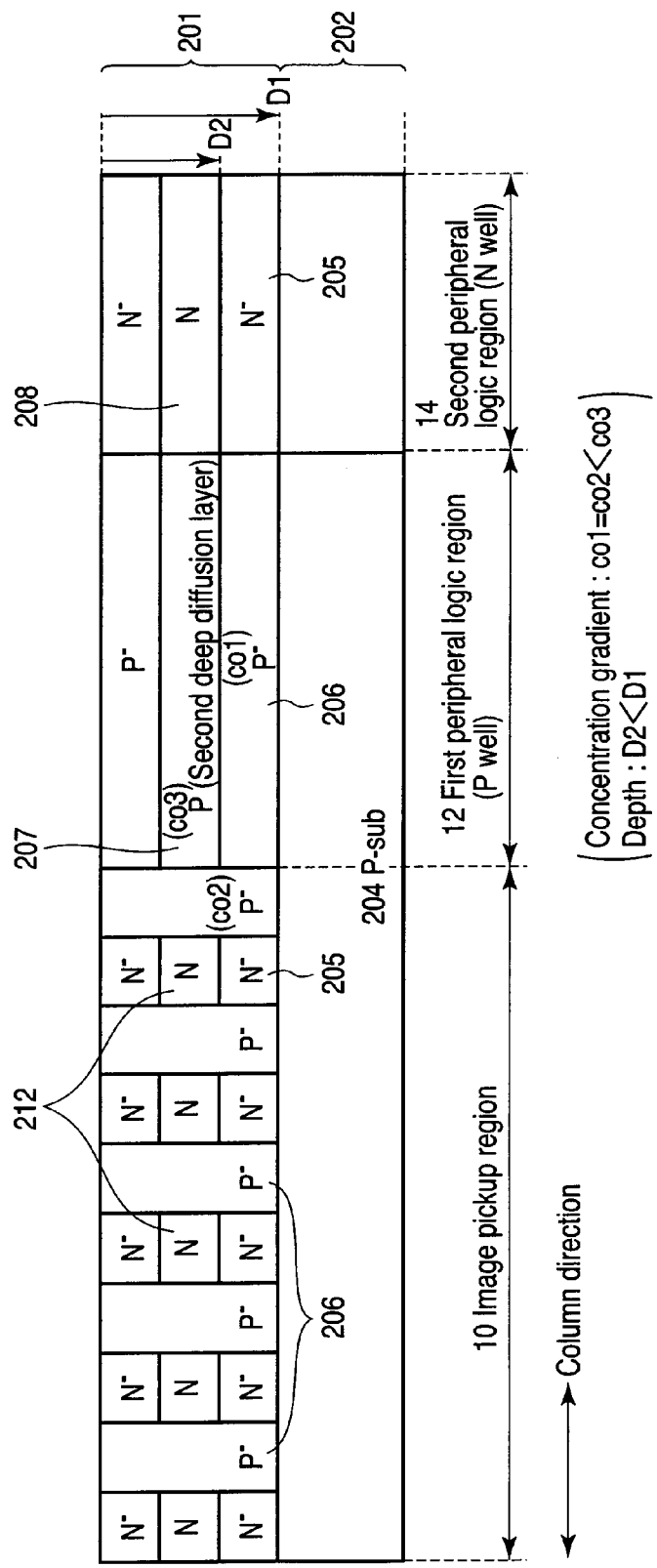
F I G. 6

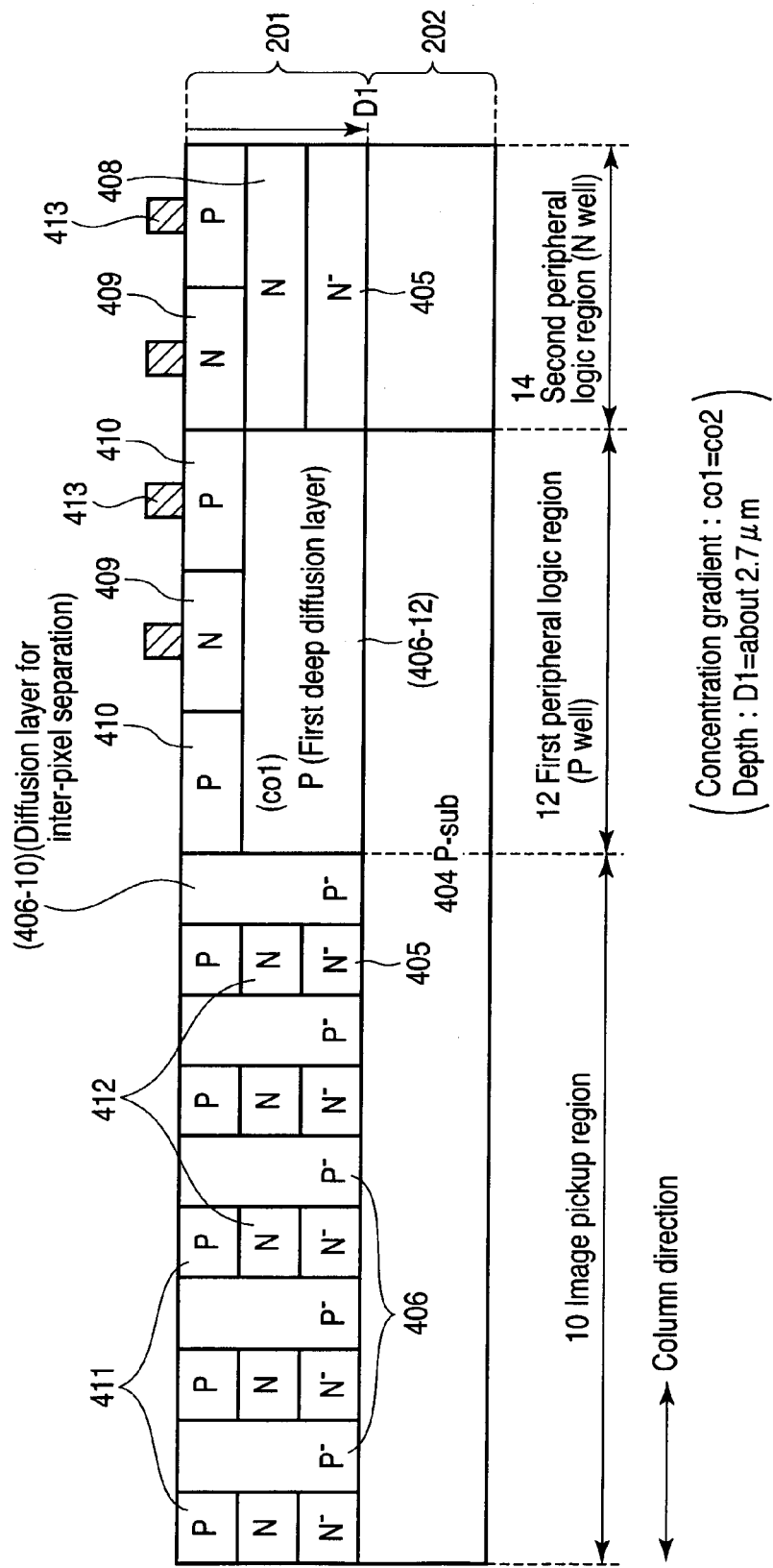
F I G. 15

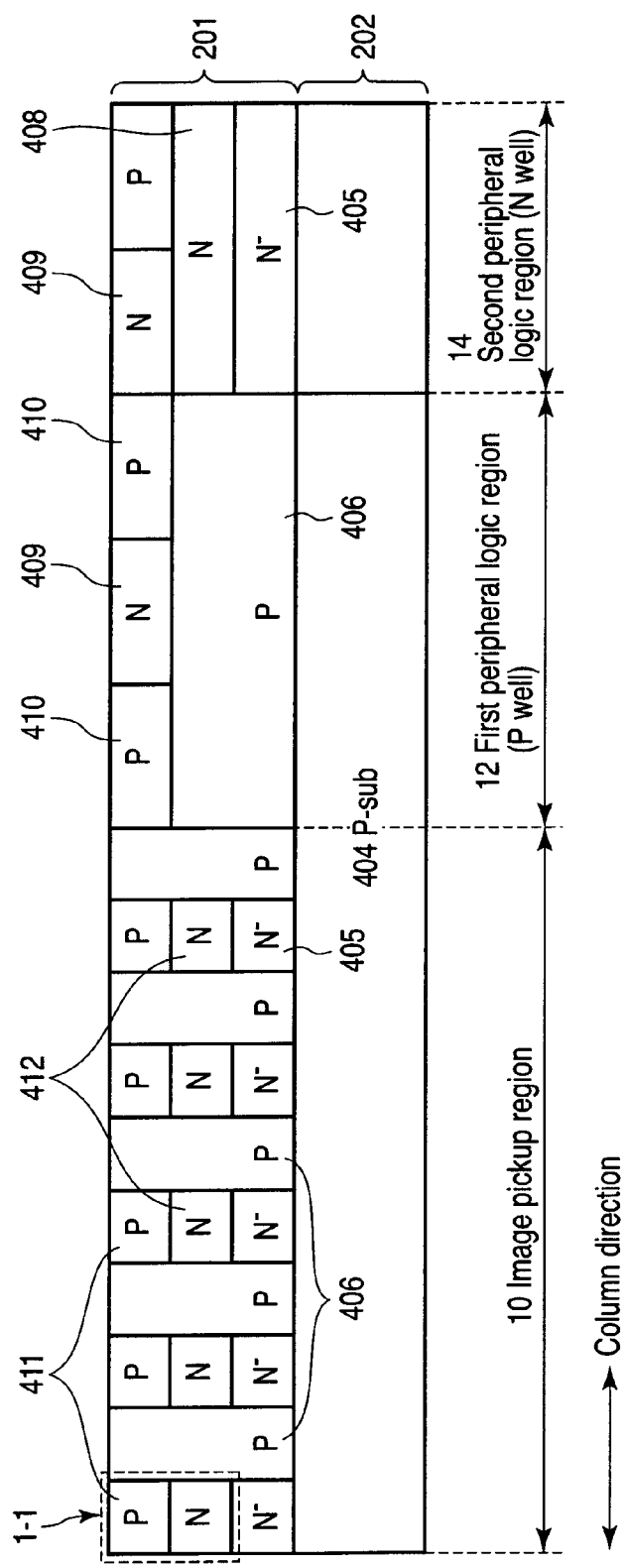
F I G. 19

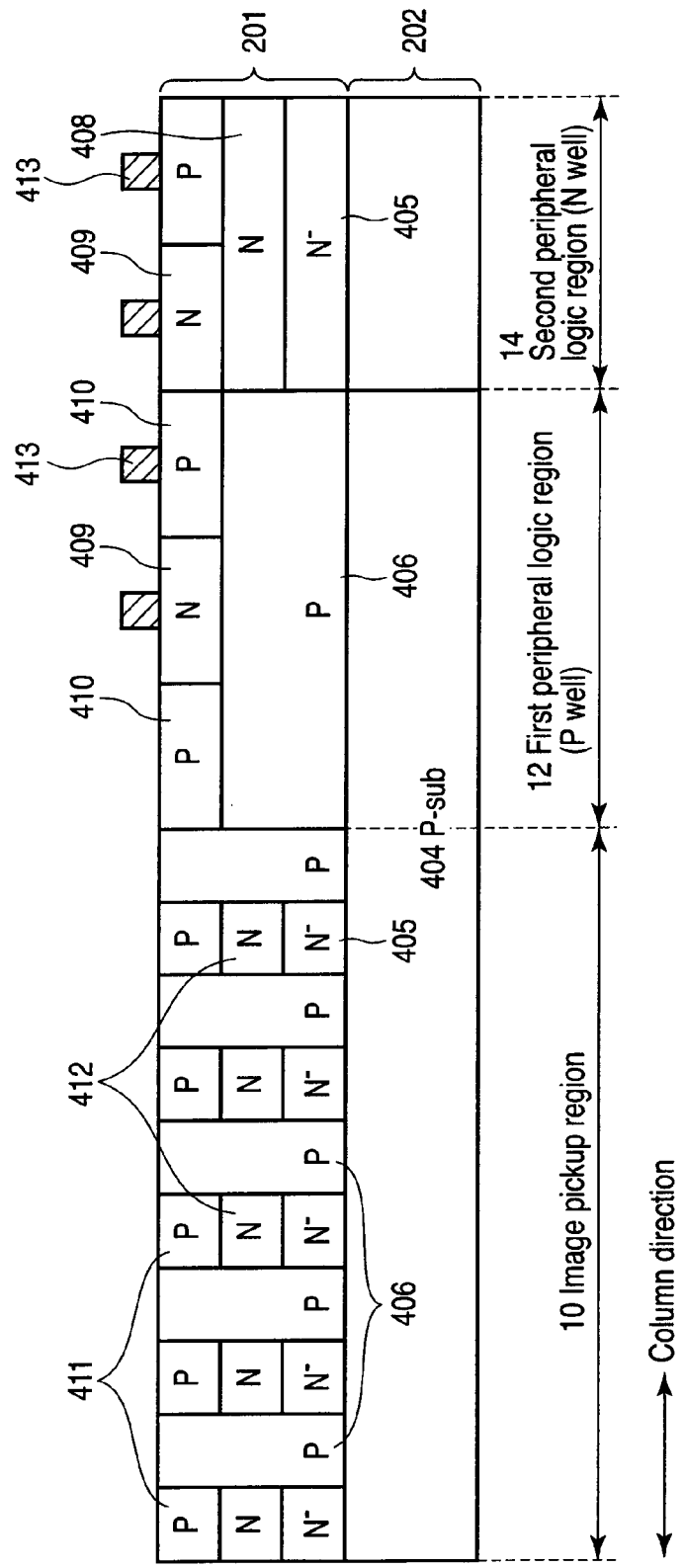
F I G. 20

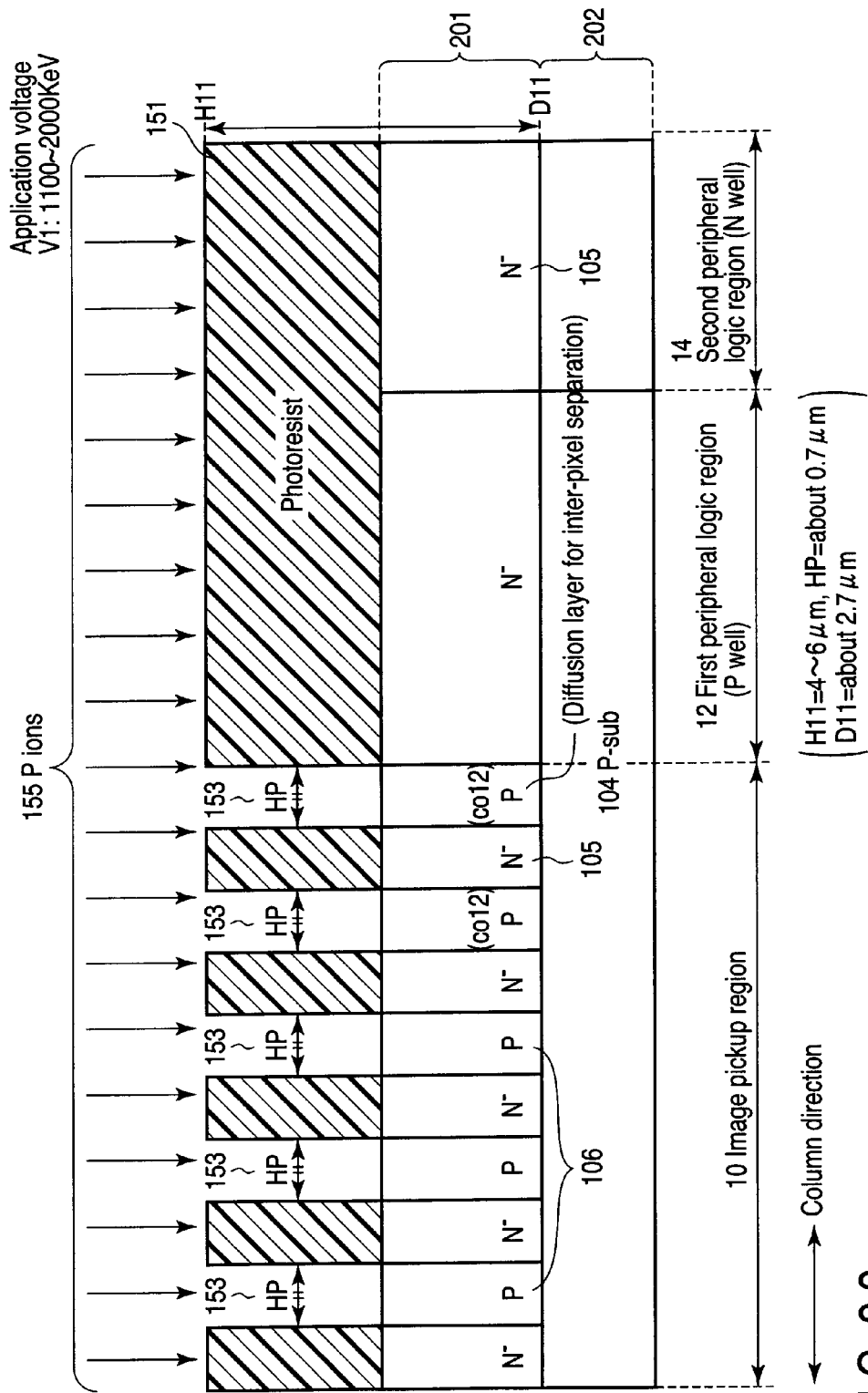
F I G. 22

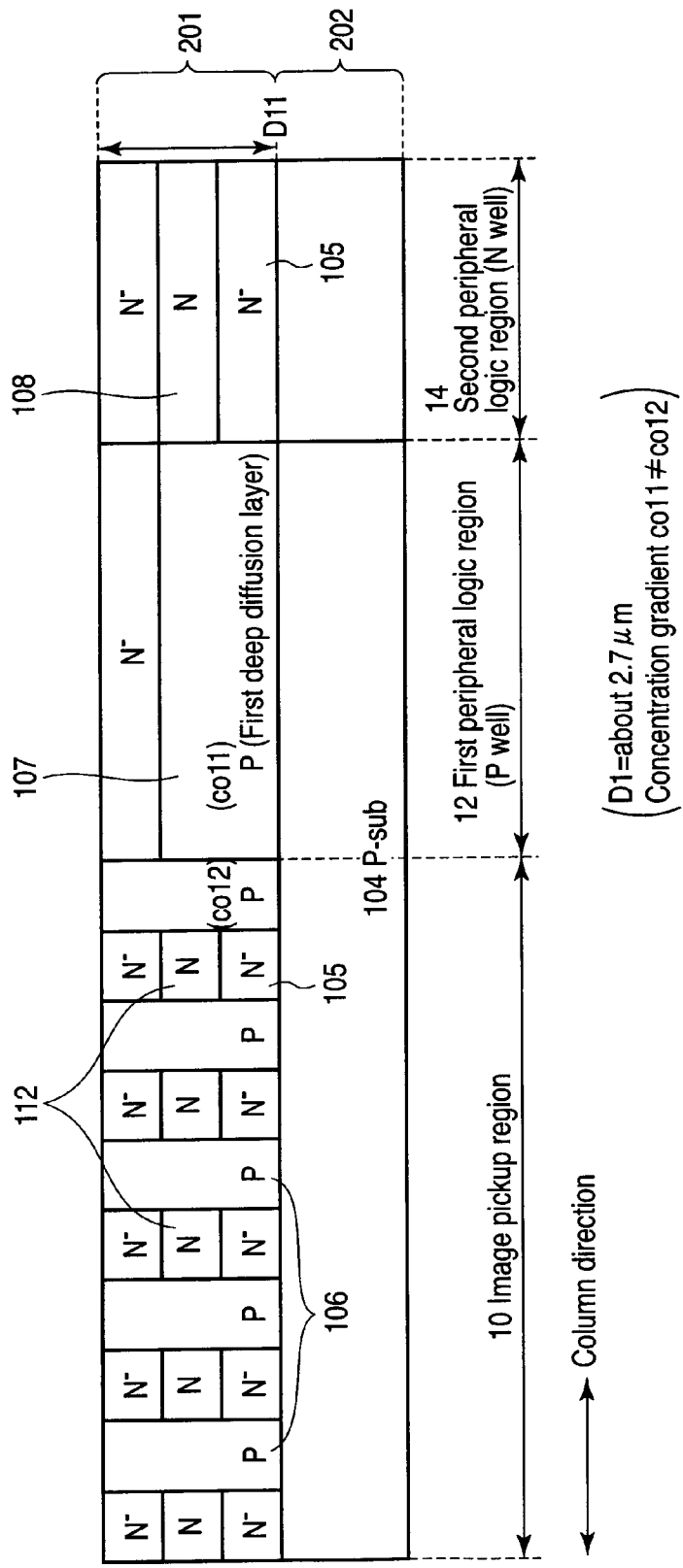
F I G. 23

SOLID-STATE IMAGING DEVICE AND MANUFACTURING METHOD THEREOF

CROSS REFERENCE TO RELATED APPLICATIONS

This is a Continuation Application of PCT Application No. PCT/JP2009/052359, filed Feb. 5, 2009, which was published under PCT Article 21(2) in English.

This application is based upon and claims the benefit of priority from Japanese Patent Application No. 2008-110642, filed Apr. 21, 2008, the entire contents of which are incorporated herein by reference.

FIELD

Embodiments described herein relate generally to a solid-state imaging device and a manufacturing method thereof, for example.

BACKGROUND

In a solid-state imaging device such as an image sensor, a peripheral logic region serving as, for example, a horizontal shift register or the like is disposed around an image pickup region (a pixel region) (for example, see Jpn. Pat. Appln. KOKAI Publication No. 2003-60192). Here, a step of forming a diffusion layer for inter-pixel separation within the pixel region (pixel array) and a step of forming a deep diffusion layer for electrical connection to a substrate within the peripheral logic region are largely different in a manufacturing step thereof. Therefore, it is difficult to apply a common step to the step of forming a diffusion layer for such a inter-pixel separation and the step of forming the deep diffusion layer. This is because of special factors such as using photoresist with high aspect as a mask in the forming step of the diffusion layer for the pixel separation in the pixel region, necessity for formation at the deepest position of a semiconductor substrate, and the like.

Here, a high energy ion implantation step applied when ions are implanted at the deepest position of the semiconductor substrate is an expensive step requiring a very high manufacturing cost. Therefore, it is desired to eliminate such a high energy ion implantation step in view of reduction of manufacturing cost.

In the conventional configuration and a manufacturing method thereof, however, since the number of times of the high energy ion implantation step performed when ions are implanted at a deep position of the semiconductor substrate cannot be eliminated, there is such a tendency that the conventional configuration and manufacturing method are disadvantageous regarding the reduction of manufacturing cost.

As one example, when it is tried to form the deep diffusion layer, for example, at a depth position of about 2.0 µm from a silicon (Si) substrate surface, high acceleration energy of about 1600 keV (1.6 MeV) is required therefor.

Further, for example, when it is tried to form the diffusion layer for the pixel separation at a depth position of about 2.7 µm from the silicon (Si) substrate surface like the above, high acceleration energy of 2000 keV (2.0 MeV) is required therefor.

Thus, in the conventional configuration and a manufacturing method thereof, since the high energy ion implantation step must be performed at least two times and the number of times of the high energy ion implantation step cannot be reduced, there is such a tendency that the conventional configuration and manufacturing method are disadvantageous regarding the reduction of manufacturing cost.

BRIEF DESCRIPTION OF THE DRAWINGS

FIG. 3 is a sectional view for explaining a sectional configuration example of the solid-state imaging device according to the first embodiment;

FIG. 5 is a sectional view for explaining one manufacturing step of the solid-state imaging device according to the first embodiment;

FIG. 6 is a sectional view for explaining one manufacturing step of the solid-state imaging device according to the first embodiment;

FIG. 15 is a sectional view for explaining a sectional configuration example of a solid-state imaging device according to a third embodiment of the present invention;

FIG. 19 is a sectional view for explaining one manufacturing step of the solid-state imaging device according to the third embodiment;

FIG. 20 is a sectional view for explaining one manufacturing step of the solid-state imaging device according to the third embodiment;

FIG. 22 is a sectional view for explaining one manufacturing step of the solid-state imaging device according to the comparative example;

FIG. 23 is a sectional view for explaining one manufacturing step of the solid-state imaging device according to the comparative example;

DETAILED DESCRIPTION

Figure 1:
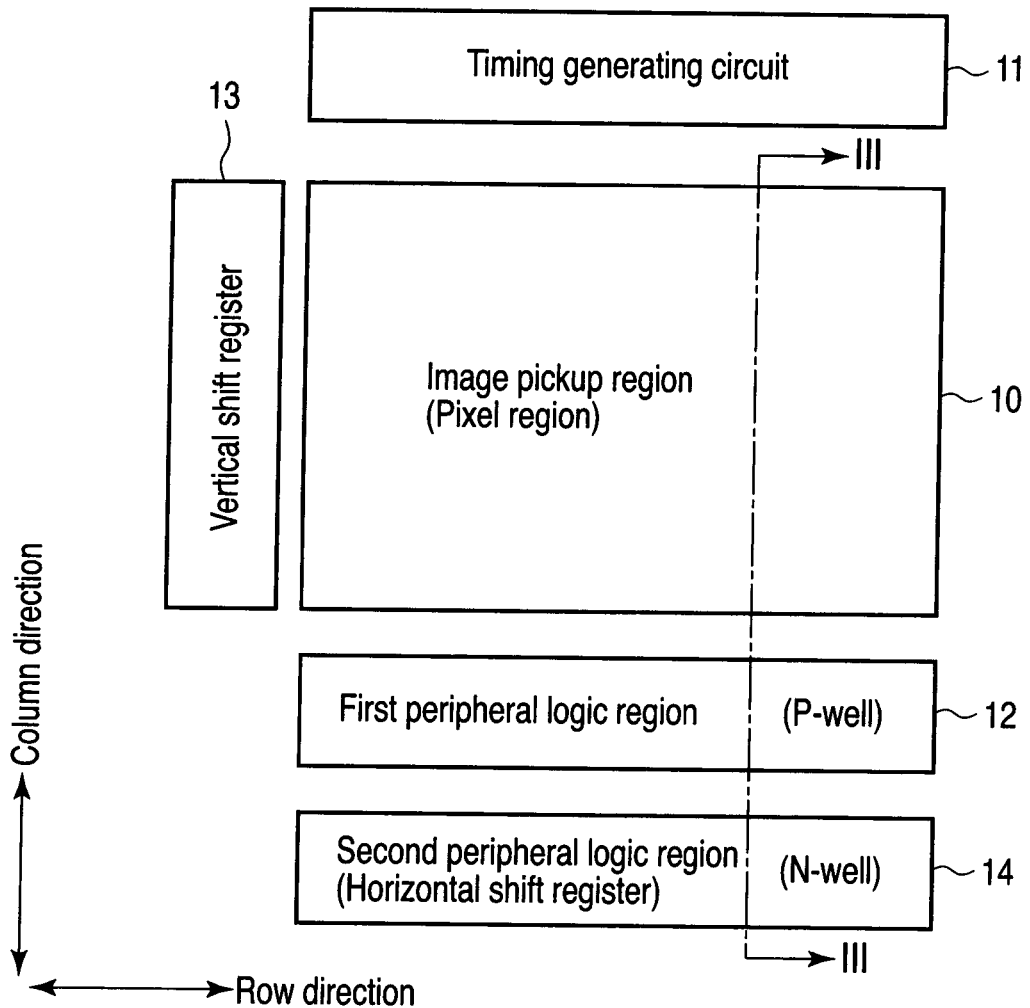
FIG. 1 is a block diagram showing an overall configuration example of a solid-state imaging device according to a first embodiment of the present invention.

In general, according to one embodiment, explained below with reference to the drawings. In the explanation, common portions through all figures are attached with common reference numerals.

[First Embodiment]
<1. Configuration Example>
Referring to FIG. 1 to FIG. 3, first, a configuration example of a solid-state imaging device according to a first embodiment of the present invention will be explained.

1-1. Overall Configuration Example

Referring to FIG. 1, an overall configuration example of a solid-state imaging device according to this embodiment will be explained. As illustrated, a solid-state imaging device (an image sensor) according to the present embodiment is provided with an image pickup region (pixel region) 10, a timing generating circuit 11, a first peripheral logic region (P well region) 12, a vertical shift register 13, and a second peripheral logic region (an N well region) 14.

The pixel region 10 is provided with a plurality of unit pixels (pixels) arranged in a matrix manner.

The timing generating circuit 11 transmits control signals for controlling timing to the pixel region 10, the vertical shift register 13, and the like.

The first peripheral logic region (P well region) 12 is disposed adjacent to the pixel region 10 along a column direction, where, for example, an amplifying transistor configuring a unit pixel and the like are disposed.

The vertical shift register 13 (Vertical Shift register) functions as a selecting section to output a predetermined signal to the pixel region 10 to select unit pixels for each row. Analog signals (Vsig) corresponding to amounts of light incident on unit pixels in the selected row are outputted from the unit pixels to the horizontal shift register 14 via vertical signal lines (VSL).

A horizontal register is disposed in the second peripheral logic region (N well region) 14. The horizontal register outputs a selection pulse to a control terminal of a horizontal selecting transistor within the pixel region 10, thereby selecting a predetermined vertical signal line (VSL).

1-2. Equivalent Circuit Example of Pixel Region

Figure 2:
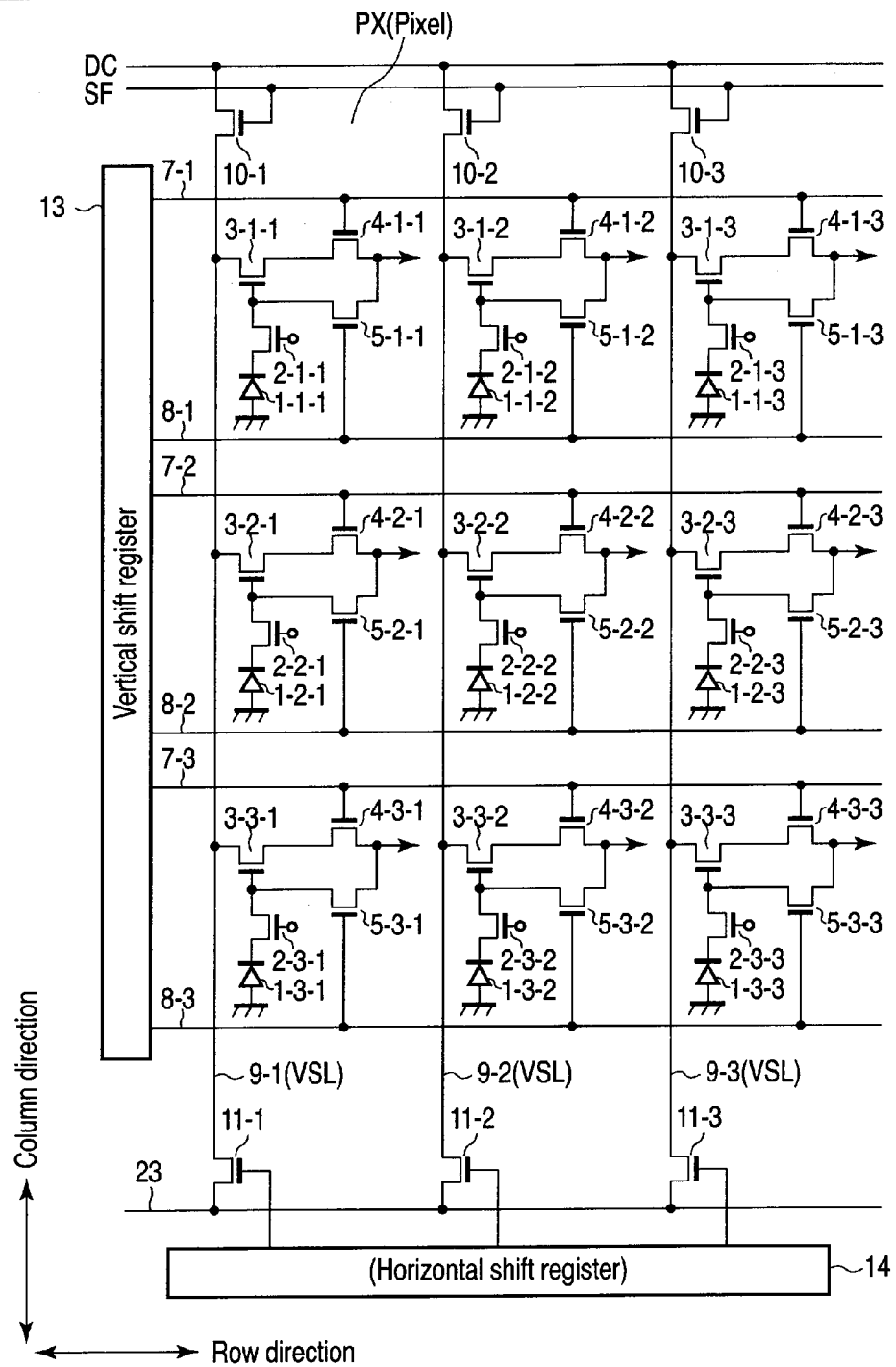
FIG. 2 is a circuit diagram showing an equivalent circuit of a image pickup region in FIG. 1.

Next, an equivalent circuit example of the pixel region according to the present embodiment will be explained with reference to FIG. 2.

As illustrated, a plurality of unit pixels PX (Pixel) is arranged in the pixel region 10 in a matrix manner.

The unit pixels PX are respectively provided with photodiodes 1 (1-1-1, 1-1-2,~, 1-3-3) for performing photoelectric conversion, read transistors 2 (2-1-1, 2-1-2,~, 2-3-3) for reading a signal thereof, amplifying transistors 3 (3-1-1, 3-1-2, ~3-3-3) for amplifying read signal charge, vertical selecting transistors 4 (4-1-1, 4-1-2, ~, 4-3-3) for selecting a line for reading a signal, and reset transistors 5 (5-1-1, 5-5-2, ~, 5-3-3) for resetting signal charge. Incidentally, unit pixels PX more than the illustrated number of unit pixels are arranged in fact.

Horizontal address lines 7 (7-1, ~, 7-3) arranged from the vertical shift register 13 in a horizontal direction are connected to the gates of the vertical selecting transistors 4 to determine lines from which a signal is read. Reset lines 8 (8-1, ~, 8-3) are connected to the gates of reset transistors 5. The sources of the amplifying transistors 3 are connected to vertical signal lines 9 (9-1, ~, 9-3) whose one ends are provided with load transistors 10 (10-1, ~, 10-3). The other ends of the vertical signal lines 9 (VSL) are connected to horizontal signal lines 13 via horizontal selecting transistors 11 (11-1, ~, 11-3) selected by a selection pulse supplied from the horizontal shift register 12.

The gates of the load transistors 10 (10-1, ~, 10-3) are connected to selection signal lines SF, the drains thereof are connected to the sources of the amplifying transistors 3, and the sources thereof are connected to control signal lines DC.

1-3. Sectional Configuration Example

Next, a sectional configuration example of the solid-state imaging device according to the present embodiment will be explained with reference to FIG. 3. A sectional configuration example taken along line III-III in FIG. 1 will be explained below as one example in the present embodiment. Incidentally, in this explanation, details of a source-drain diffusion layer, a wiring layer disposed in an interlayer insulating film 200, and the like will be omitted.

As illustrated, a P type semiconductor substrate 204 (P-sub) includes a diffusion layer region 201 provided on a surface thereof and a substrate region 202 other than the diffusion layer region 201. The pixel region 10, the first peripheral logic region (P well region) 12, and the second peripheral logic region (N well region) 14 are sequentially disposed in the diffusion layer region 201 of the P type semiconductor substrate 204 along in a column direction.

The pixel region 10 is provided with a plurality of unit pixels PX (Pixel) as shown by a dotted line in a surrounding manner. Each unit pixel PX is provided with a diffusion layer (P⁻ type well layer) 206-10 for pixel (inter-pixel) separation provided on the diffusion region 201 of the P type semiconductor substrate 204, an N⁻ type well layer 205-10, a P type well layer 211, an N type well layer 212, a gate electrode 213-10, and a micro lens ML.

The diffusion layers (P⁻ type well layers) 206-10 for pixel (inter-pixel) separation are provided at a pixel pitch from the deepest position D1 in the diffusion layer region 201 to a surface along the column direction. A concentration gradient of P type impurity in the diffusion layer for pixel separation is about co2.

The N⁻ type well layer 205-10 is provided at the deepest position in the semiconductor substrate 204 so as to electrically separate the semiconductor substrate 204 and the unit pixel.

The P type well layer 211 and the N type well layer 212 are P-N joined to form a photodiode 1-1 configuring the unit pixel, as surrounded by a dotted line.

The gate electrode 213-10 and a source-drain diffusion layer (not shown) form the read transistor 2-1 configuring the unit pixel.

An interlayer insulating film 200 is provided so as to cover the photodiodes and the read transistors, and micro lenses ML are respectively provided on portions of the interlayer insulating film 200 corresponding to the photodiodes. Light collected by the micro lenses ML is photoelectrically converted by the photo diodes to be read by the read transistors, respectively.

The first peripheral logic region (P well region) 12 includes a first deep diffusion layer (P⁻ type diffusion layer) 206-12, a second deep diffusion layer (P type diffusion layer) 207, an N type diffusion layer 209, a P type diffusion layer 210, and gate electrodes 213-12 which are provided on the semiconductor substrate 204.

The first deep diffusion layer (P⁻ type diffusion layer) 206-12 is provided at the deepest position D1 in the diffusion layer region 201, and it is provided for electrically connecting the semiconductor substrate 204 and the first peripheral logic region 12 such as the amplifying transistors 3-1 and the like. Further, since the first deep diffusion layer 206-12 can be formed simultaneously with formation of the abovementioned diffusion layer for pixel separation 206-10, as described later, it has the same concentration gradient co1 (=co2) as that of the diffusion layer for pixel separation 206-10. In the present embodiment, the deepest position D1 of the diffusion layer region 201 provided with the first deep diffusion layer 206-12 is, for example, about 2.7 µm.

The second deep diffusion layer (P type diffusion layer) 207 is provided at a position on the first deep diffusion layer in the semiconductor substrate 204 and it has a second concentration gradient co3 higher than the first concentration gradient co1 (concentration gradient: co1<co3).

The N type diffusion layer 209 is provided near a surface of the semiconductor substrate 204 on the second deep diffusion layer 207.

The P type diffusion layer 210 is provided near a surface of the semiconductor substrate 204 on the second deep diffusion layer 207.

The gate electrodes 213-12 are provided on the N-type diffusion layer 209 and the P-type diffusion layer 210 and they configure the amplifying transistors 3-1 configuring the unit pixel PX along with the source-drain diffusion layer (not shown), and the like, for example.

The second peripheral logic region (N well region) 14 is provided with an N⁻ type diffusion layer 206-14, an N type diffusion layer 208, an N type diffusion layer 209, a P type diffusion layer 210, and gate electrodes 213-14, provided on the semiconductor substrate 204.

The N⁻ type diffusion layer 205-14 is provided at the deepest position D1 of the diffusion layer 201 and it is provided for electrically separating the semiconductor substrate 204 and the second peripheral logic region 14 such as a transistor having a gate from each other.

The N type diffusion layer 208 is provided at a position on the N⁻ type diffusion layer 205-14 in the semiconductor substrate 204.

The gate electrodes 213-14 are provided on the N type diffusion layer 209 and the P type diffusion layer 210, and it forms a transistor circuit configuring the horizontal shift register together with the source-drain diffusion layer (not shown), and the like.

2. <Manufacturing Method>

Next, a manufacturing method of a solid-state imaging device according to the present embodiment will be explained with reference to FIG. 4 to FIG. 8. Incidentally, in the explanation of this specification, the high energy ion implantation step is defined as an ion implantation step where an application voltage is "1 MeV(1000 keV) or higher". The low energy ion implantation step is defined as an ion implantation step where the application voltage is "less than 1 MeV (1000 keV)".

Figure 4:
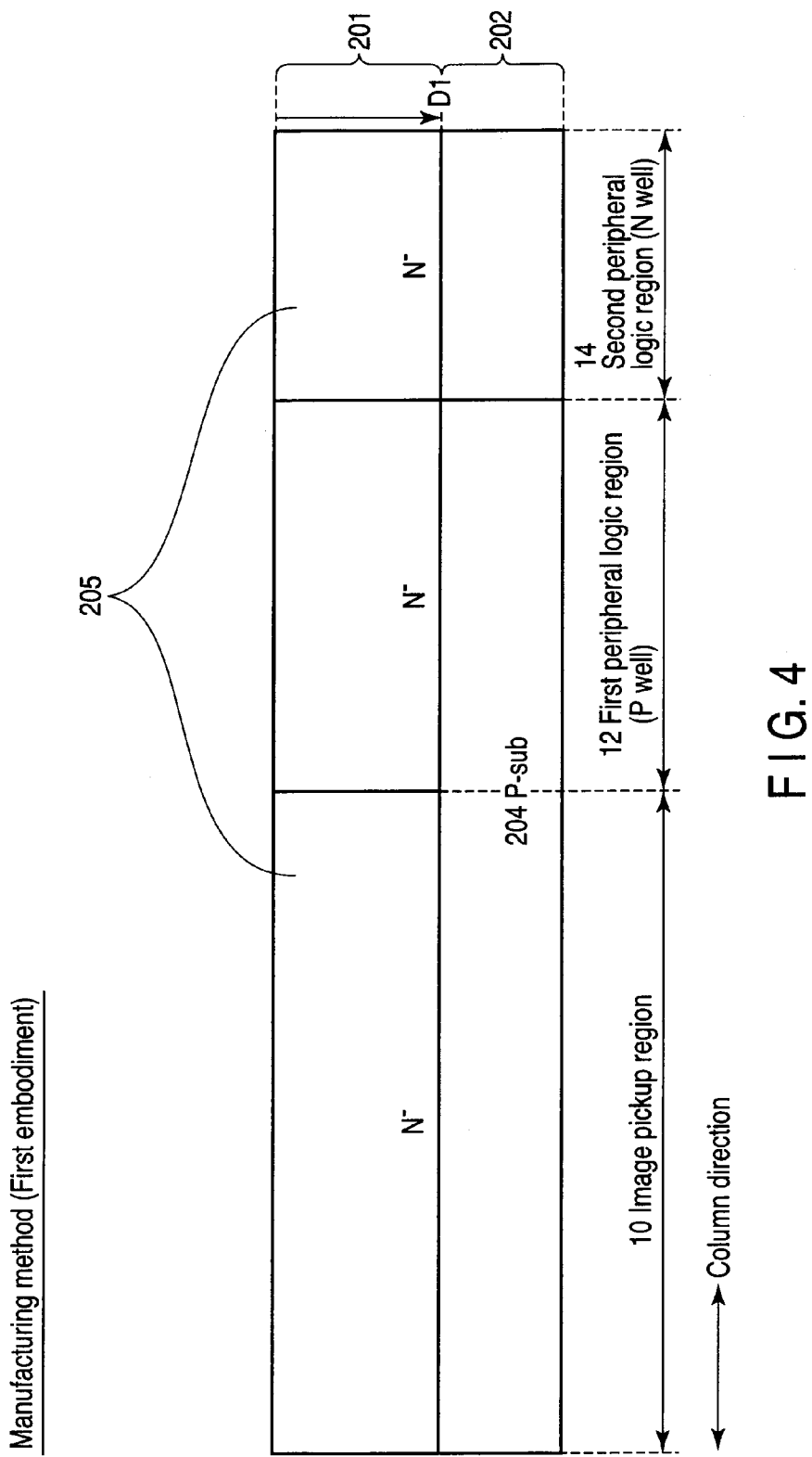
FIG. 4 is a sectional view for explaining one manufacturing step of the solid-state imaging device according to the first embodiment.

As shown in FIG. 4, first, N type impurity such as phosphorus (P) or arsenic (As) is implanted up to the deepest position D1 of the diffusion layer region 201 in the P type semiconductor substrate (P-sub) 204 (in the present embodiment, up to about 2.7 µm), for example, using an epitaxial growth step to form an N⁻ type diffusion layer 205.

Subsequently, as shown in FIG. 5, a photoresist 51 is applied to the N⁻ diffusion layer 205, exposure and development are applied to the photoresist 51 to form a pattern having openings 53 through which the pixel separation region of the pixel region 10 and the first peripheral logic region 12 are exposed. At this pattern forming step, a height H1 of the photoresist 51 is in a range from, for example, about 4 to 6 µm and a half pitch HP in the pixel region 10 is, for example, about 0.7 µm. The reason why the high photoresist 51 is required in this manner is bacause it is necessary to perform ion implantation down to the deepest position D1 of the diffusion layer region 201 at the next step.

Subsequently, P type ions 55 such as boron (B) or indium (IN) are implanted down to the deepest position D1 of the diffusion layer region 201 by high energy of an application voltage V1 (in the present embodiment, about 1100 to 2000 KeV) and by low energy of an application voltage V2 (in the present embodiment, about 300 to 800 KeV) using the photoresist 51 having the abovementioned pattern as a mask to form a diffusion layer for pixel separation 206-10 and a first deep diffusion layer (P⁻ type diffusion layer) 206-12 simultaneously. In the present embodiment, since the diffusion layer for pixel separation 206-10 and the first deep diffusion layer 206-12 can be simultaneously formed in this manner, the high energy ion implantation step can be made common. As a result, the number of times of the high energy ion implantation step can be reduced at least from two times to one time as compared with a comparative example described later, which is advantageous regarding reduction of manufacturing cost. Further, since the simultaneous formation can be performed and the high energy ion implantation step can be made common, concentration gradients of the diffusion layer for pixel separation 206-10 and the first deep diffusion layer 206-12 near the deepest position D1 of the diffusion layer region 201 are formed to be equal to each other (co1=co2).

Subsequently, as shown in FIG. 6, after the photoresist is removed, ions of P type such as boron (B) or indium (IN) are implanted down to a position D2 shallower than the deepest position D1 of the diffusion layer region 201 by, for example, an application voltage (in the present embodiment, about 800 KeV) using a predetermined mask pattern as a mask (not shown) to perform overlapping implantation with the previously formed P⁻ type diffusion layer 206-12, thereby forming a second deep diffusion layer (P type diffusion layer) 207. Since the second deep diffusion layer 207 can be formed by overlapping ion implantation with the previously formed first deep diffusion layer (P⁻ type diffusion layer) 206-14 in this manner, the ion implantation step 207 can be performed with acceleration energy of, for example, about 800 KeV. As a result, the concentration gradient co3 of P type impurity contained in the second deep diffusion layer (P type diffusion layer) becomes larger than that of the first deep diffusion layer (co3>co1).

Subsequently, N type diffusion layers 208 and 212 are formed down to a position D2 of the semiconductor substrate 204 in the pixel region 10 and the second peripheral logic region 14 using a manufacturing step similar to the above.

Figure 7:
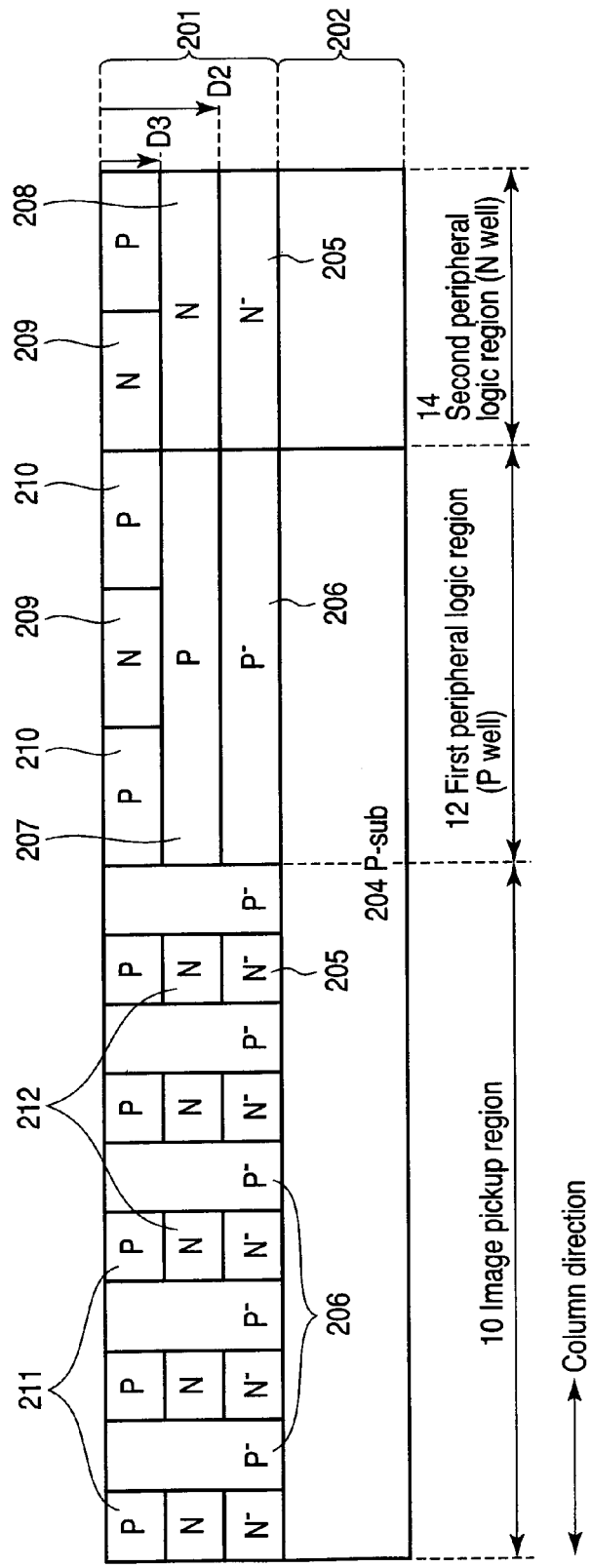
FIG. 7 is a sectional view for explaining one manufacturing step of the solid-state imaging device according to the first embodiment.

Subsequently, as shown in FIG. 7, P type diffusion layers 211 and 210 are formed down to a position D3 of the semiconductor substrate 204 in the pixel region 10, the first peripheral logic region 12, and the second peripheral logic region 14 using a manufacturing step similar to the above. At this step, photo diodes 1-1 are formed in the pixel region 10. Subsequently, N type diffusion layers 209 are formed down to a position D3 of the semiconductor substrate 204 in the first peripheral logic region 12, and the second peripheral logic region 14 using a manufacturing step similar to the above.

Figure 8:
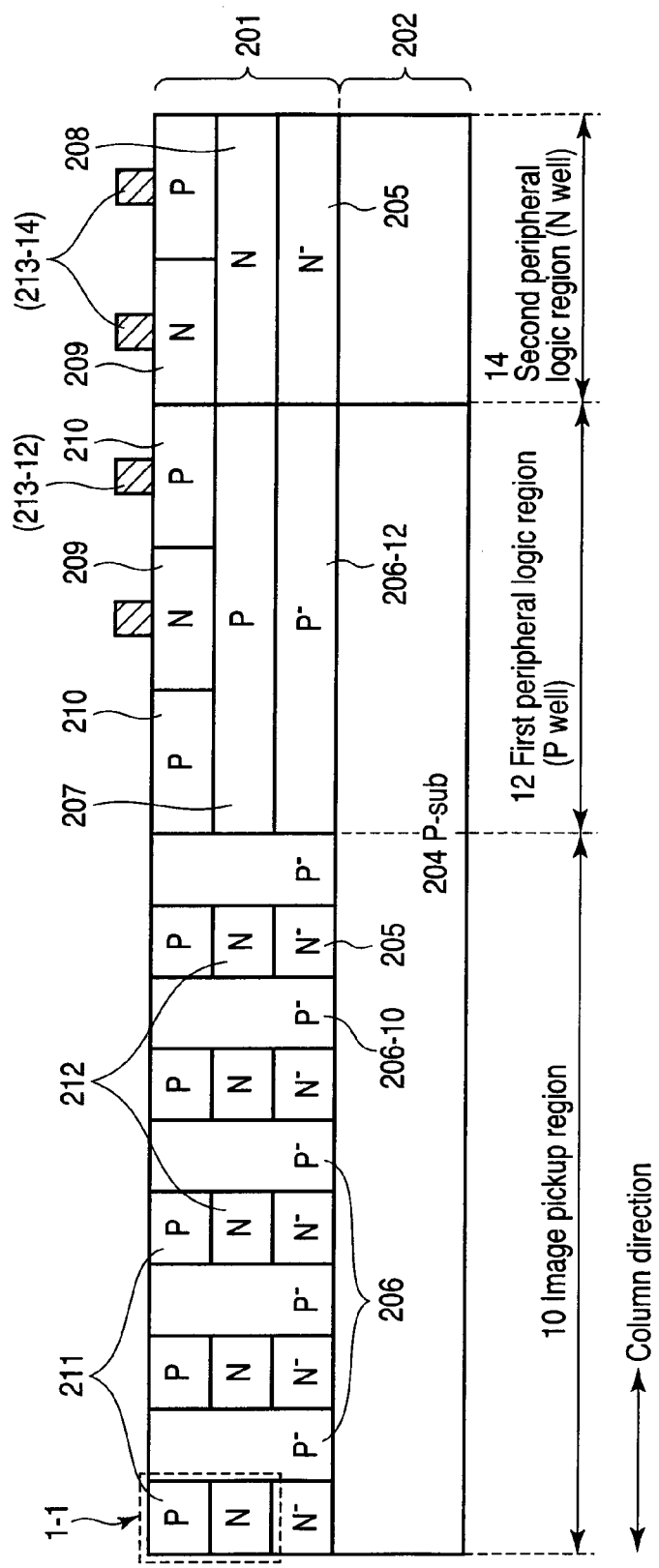
FIG. 8 is a sectional view for explaining one manufacturing step of the solid-state imaging device according to the first embodiment.

Subsequently, as shown in FIG. 8, a silicon oxide film and a polysilicon are sequentially formed on the N type diffusion layer 209 and the P type diffusion layer 210 in the first peripheral logic region 12 and the second peripheral logic region 14 to form gate electrodes 213 using a well-known manufacturing step. Subsequently, impurity is implanted using the gate electrodes 213 as masks to perform thermal diffusion, thereby forming source-drain diffusion layers (not shown) in the N type diffusion layer 209 and the P type diffusion layer 210 such that the source-drain diffusion layers are disposed so as to be separated from each other in a sandwiching manner of the gate electrode 213.

Subsequently, read transistors and the like are formed in the pixel region 10 using a well-known manufacturing step. Subsequently, a silicon oxide film or the like is deposited so as to cover the pixel region 10, and the first and second peripheral logic regions 10 and 14, for example, using CVD (chemical vapor deposition) method or the like to form an interlayer insulating film (not shown). Finally, micro lenses are formed on the pixel region 10 using a well-known manufacturing step to manufacture a solid-state imaging device (image sensor) shown in FIG. 3.

3. <Operation and Effect of the Embodiment>

According to the solid-state imaging device and a manufacturing method thereof according to the present embodiment, at least the following effect (1) can be obtained.

(1) Since the high energy ion implantation step can be made common to reduce the number of manufacturing steps, the embodiment is advantageous regarding reduction of manufacturing cost.

As described above, the solid-state imaging device according to the present embodiment is provided with the P⁻ type diffusion layer for pixel separation 206-10 whose bottom portion is provided at the deepest position D1 of the diffusion layer region 201 in the pixel region 10, and the first deep diffusion layer (P⁻ type diffusion layer) 206-12 which is provided for electrically connecting the semiconductor substrate 204 and the first peripheral logic region 12 at the deepest position D1 of the diffusion layer region 201 in the first peripheral logic region 12 and has the first concentration gradient (co1=co2) equal to that of the diffusion layer for pixel separation 206-10.

According to the abovementioned configuration, since the diffusion layer for pixel separation 206-10 and the first deep diffusion layer 206-12 can be formed simultaneously in this manner, the high energy ion implantation step can be made common. Therefore, for example, the number of times of the high energy ion implantation step can be reduced at least from two times to one time, as compared with the comparative example described later. Since the high energy ion implantation step can be made common to reduce the number of manufacturing steps in this manner, the present embodiment is advantageous regarding reduction of manufacturing cost.

Further, as shown in FIG. 6, the second deep diffusion layer 207 can be formed by overlapping ion implantation with the previously formed first deep diffusion layer (p⁻ type diffusion layer) 206-14. Therefore, since the ion implantation step forming the second deep diffusion layer 207 can be performed with acceleration energy of, for example, about 800 KeV, the present embodiment is advantageous regarding reduction of manufacturing cost.

[Second Embodiment (One Example where Deep Diffusion Layer is Equal to Pixel Pitch)]

Next, a solid-state imaging device and a manufacturing method thereof according to a second embodiment will be explained with reference to FIG. 9 to FIG. 14. The present embodiment relates to one example where a pixel pitch in a pixel region and a pitch of first deep diffusion layers arranged in a first peripheral logic region are common in arrangement. In this explanation, detailed explanation about portions overlapping with those in the first embodiment will be omitted.

<Sectional Configuration Example>

Figure 9:
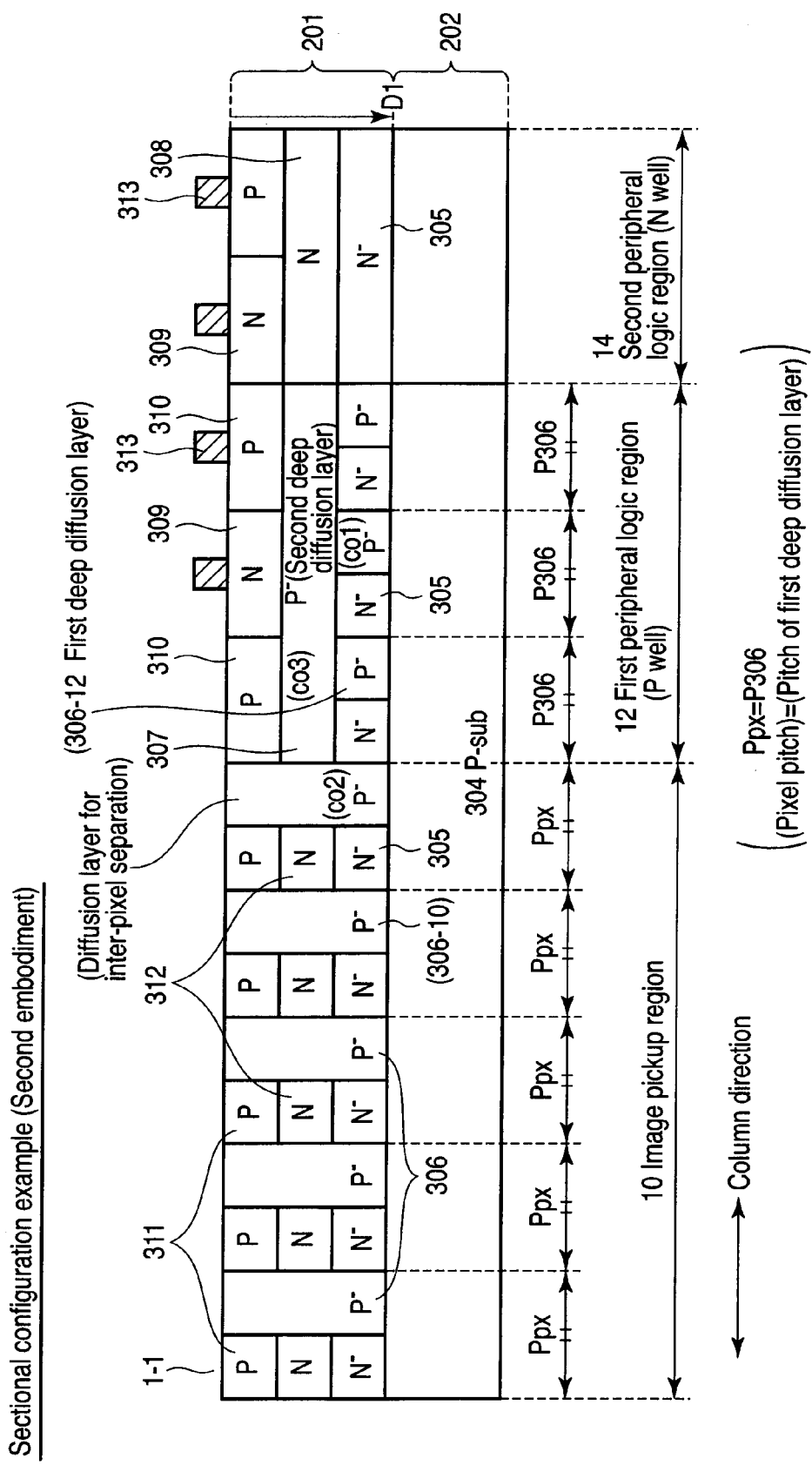
FIG. 9 is a sectional view for explaining a sectional configuration example of a solid-state imaging device according to a second embodiment of the present invention.

First, a sectional configuration example of the solid-state imaging device according to the present embodiment will be explained with reference to FIG. 9.

As illustrated, the second embodiment is different from the first embodiment in such a configuration that a pixel pitch PPX in a pixel region 10 is equal to a pitch P306 of first deep diffusion layers 306-12 arranged in a first peripheral logic region 12 (PPX=P306). In other words, the diffusion layers for pixel separation 306 and the first deep diffusion layers 306-12 are arranged at the same pitch (as one example, about 1.4 μm).

Further, in the present embodiment, N⁻ type diffusion layers 305 are arranged at the deepest position D1 of the diffusion layer region 201 in the first peripheral logic region 12, but the first deep diffusion layers 306-12 are similarly arranged at the deepest position D1, so that electrical connection of the P type semiconductor substrate 304 and the first peripheral logic region 12 is ensured.

<Manufacturing Method>

Next, the manufacturing method of a solid-state imaging device according to the present embodiment will be explained with reference to FIG. 10 to FIG. 14.

Figure 10:
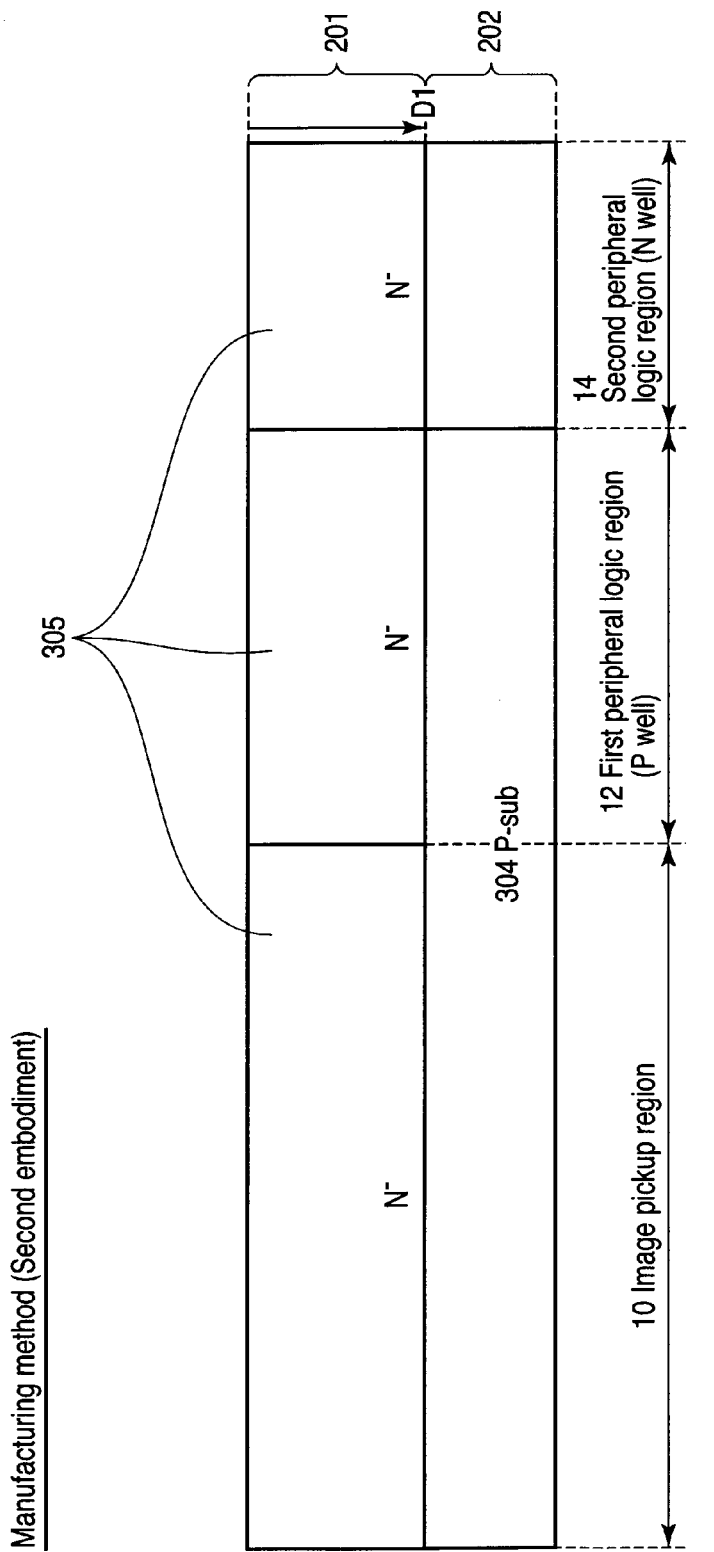
FIG. 10 is a sectional view for explaining one manufacturing step of the solid-state imaging device according to the second embodiment.

As shown in FIG. 10, first, N type impurity such as phosphorus (P) or arsenic (As) is implanted up to the deepest position D1 of the diffusion layer region 201 in the P-type semiconductor substrate (P-sub) 204 (in the present embodiment, up to about 2.7 μm), for example, using an epitaxial growth step to form an N⁻ type diffusion layer 305.

Figure 11:
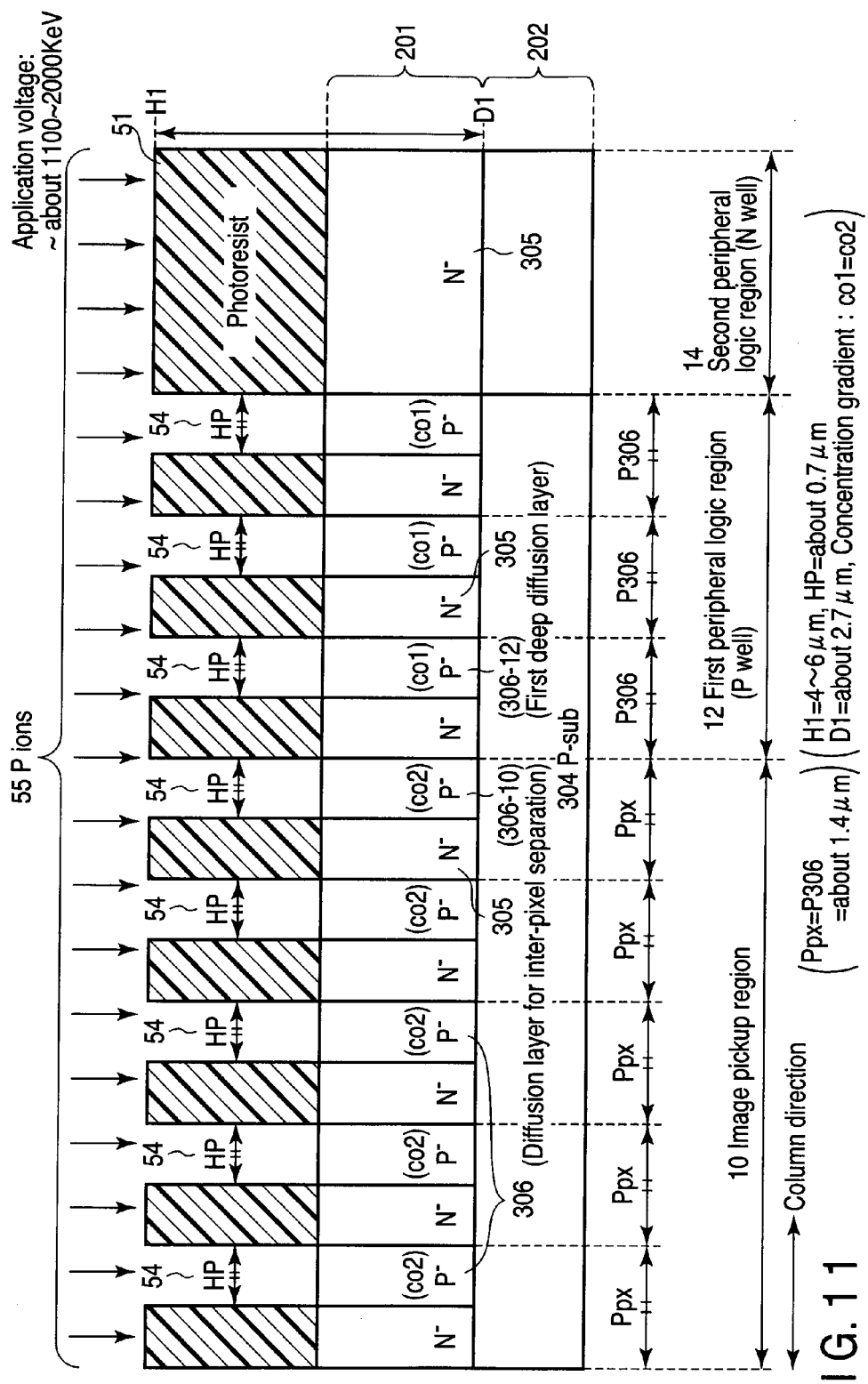
FIG. 11 is a sectional view for explaining one manufacturing step of the solid-state imaging device according to the second embodiment.

Subsequently, as shown in FIG. 11, a photoresist 51 is applied to the N⁻ diffusion layer 205, exposure and development are applied to the photoresist 51 to form a pattern having openings 54 through which the pixel separation region of the pixel region 10 and the first peripheral logic region 12 are exposed. At this pattern forming step, the openings 54 are formed such that the pixel pitch PPX in the pixel region 10 and the pitch P306 of the first deep diffusion layers 306-12 arranged in the first peripheral logic region 12 are the same (PPX=P306).

At this pattern forming step, like the above, a height H1 of the photoresist 51 is, for example, in a range from about 4 to 6 μm and a half pitch HP of the pixel region 10 and the first peripheral logic region 12 is, for example, about 0.7 μm. The reason why the high photoresist 51 is required in this manner is because it is necessary to perform ion implantation down to the deepest position D1 of the diffusion layer region 201 at the next step.

Subsequently, P type ions 55 such as boron (B) or indium (IN) are implanted down to the deepest position D1 of the diffusion layer 201 by high energy of an application voltage V1 (in the present embodiment, about 1100 to 2000 KeV) and by low energy of an application voltage V2 (in the present embodiment, about 300 to 800 KeV) using the photoresist 51 having the abovementioned pattern as a mask to form a diffusion layer for pixel separation 306-10 and a first deep diffusion layer (P⁻ type diffusion layer) 306-12 simultaneously. In the present embodiment, since the diffusion layer for pixel separation 306-10 and the first deep diffusion layer 306-12 can be simultaneously formed in this manner, the number of times of the high energy ion implantation step can be reduced at least from two times to one time, as compared with the comparative example described later, which is advantageous regarding reduction of manufacturing cost. Further, since the simultaneous formation can be performed, concentration gradients of the diffusion layer for pixel separation 306-10 and the first deep diffusion layer 306-12 near the deepest position D1 of the diffusion layer region 201 are formed to be equal to each other (co1=co2).

Figure 12:
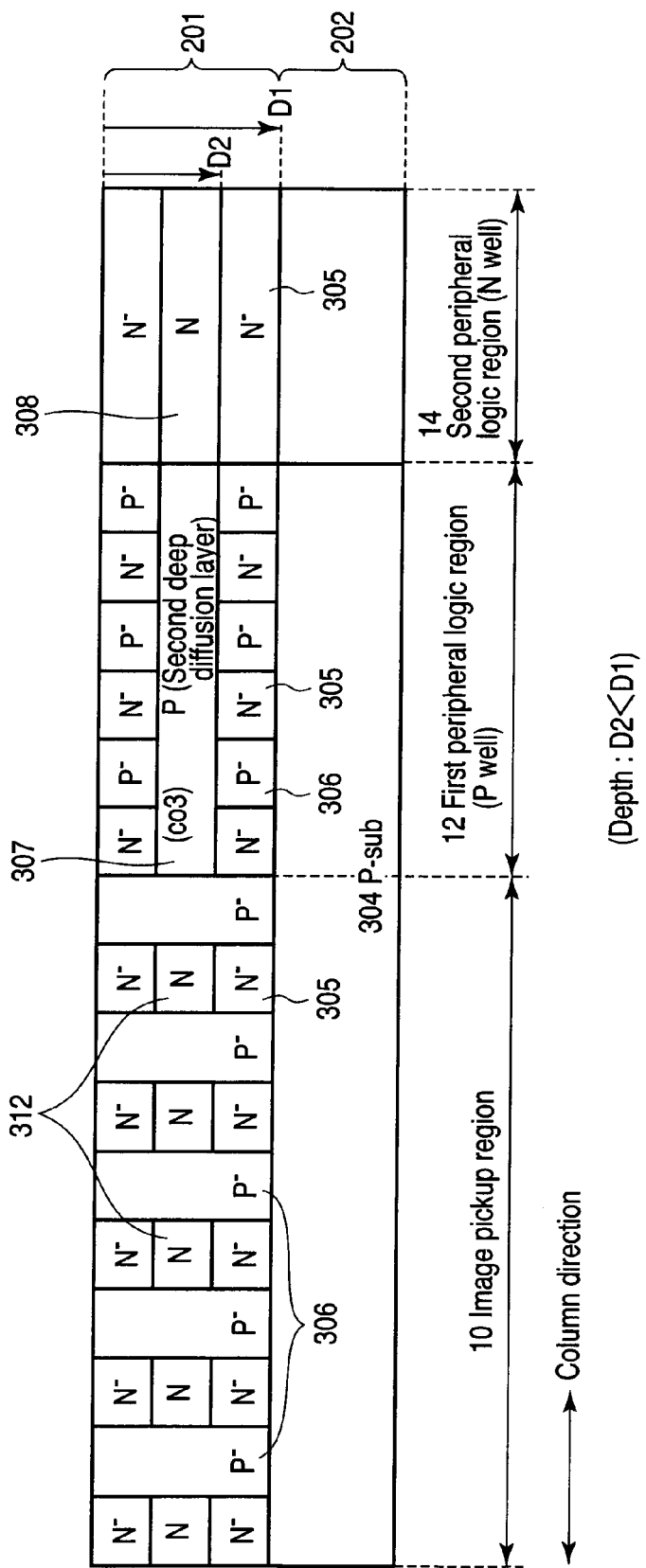
FIG. 12 is a sectional view for explaining one manufacturing step of the solid-state imaging device according to the second embodiment.

Subsequently, as shown in FIG. 12, after the photoresist is removed, ions of P type such as boron (B) or indium (IN) are implanted down to a position D2 shallower than the deepest position D1 of the diffusion layer 201 by, for example, an application voltage (in the present embodiment, about 800 KeV) using a predetermined mask pattern as a mask (not shown) to perform overlapping implantation with the P⁻ type diffusion layer 306-12, thereby forming a second deep diffusion layer (P type diffusion layer) 307. Since the second deep diffusion layer 307 can be formed by overlapping ion implantation with the previously formed first deep diffusion layer P⁻type diffusion layer) 306-12 in this manner, the ion implantation step 307 can be performed with acceleration energy of, for example, about 800 KeV. As a result, the concentration gradient co3 of P type impurity contained in the second deep diffusion layer (P type diffusion layer) 307 becomes larger than that of the first deep diffusion layer 306-12 (co3>co1).

Subsequently, N type diffusion layers 308 and 312 are formed down to a position D2 of the semiconductor substrate 304 in the pixel region 10 and the second peripheral logic region 14 using a manufacturing step similar to the above.

Figure 13:
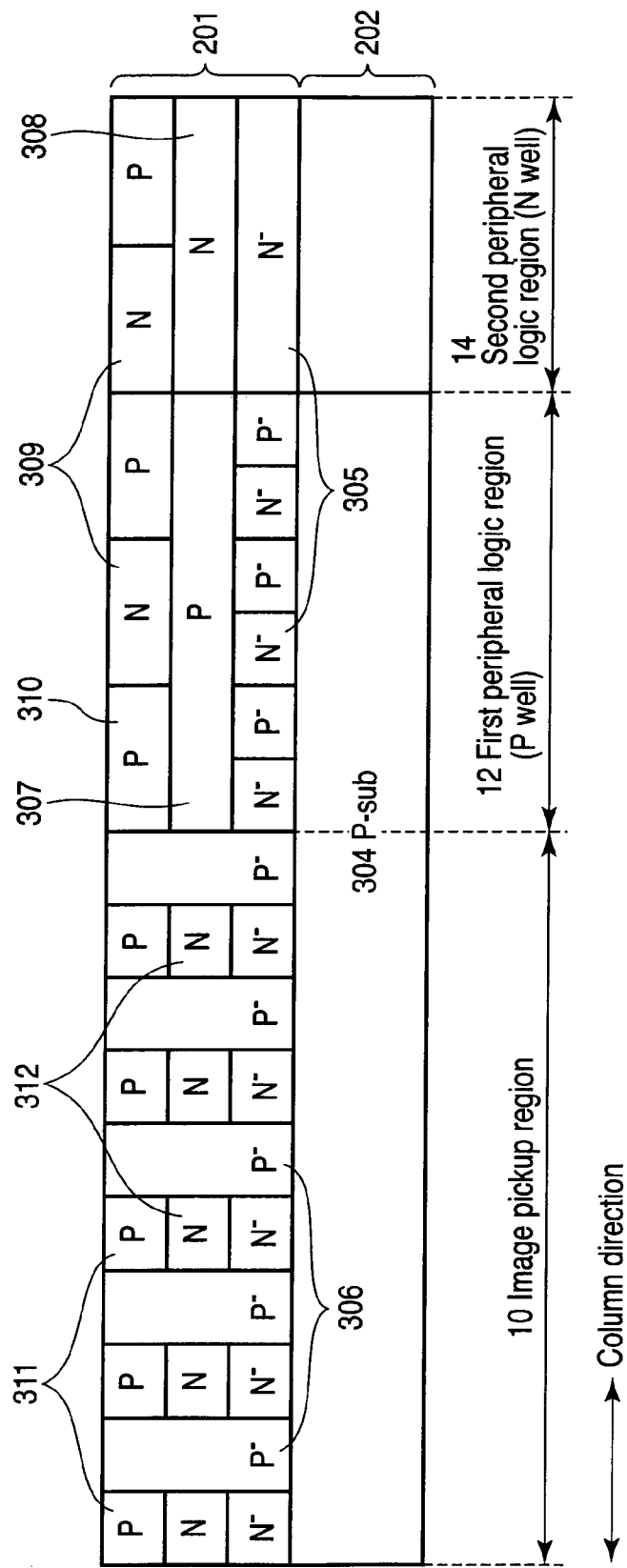
FIG. 13 is a sectional view for explaining one manufacturing step of the solid-state imaging device according to the second embodiment.

Subsequently, as shown in FIG. 13, P type diffusion layers 311 and 310 are formed down to a position near a surface of the semiconductor substrate 304 in the pixel region 10, the first peripheral logic region 12, and the second peripheral logic region 14 using a manufacturing step similar to the above. At this step, photo diodes 1-1 are formed in the pixel region 10. Subsequently, N type diffusion layers 309 are formed down a position near a surface of the semiconductor substrate 304 in the first peripheral logic region 12, and the second peripheral logic region 14 using a manufacturing step similar to the above.

Figure 14:
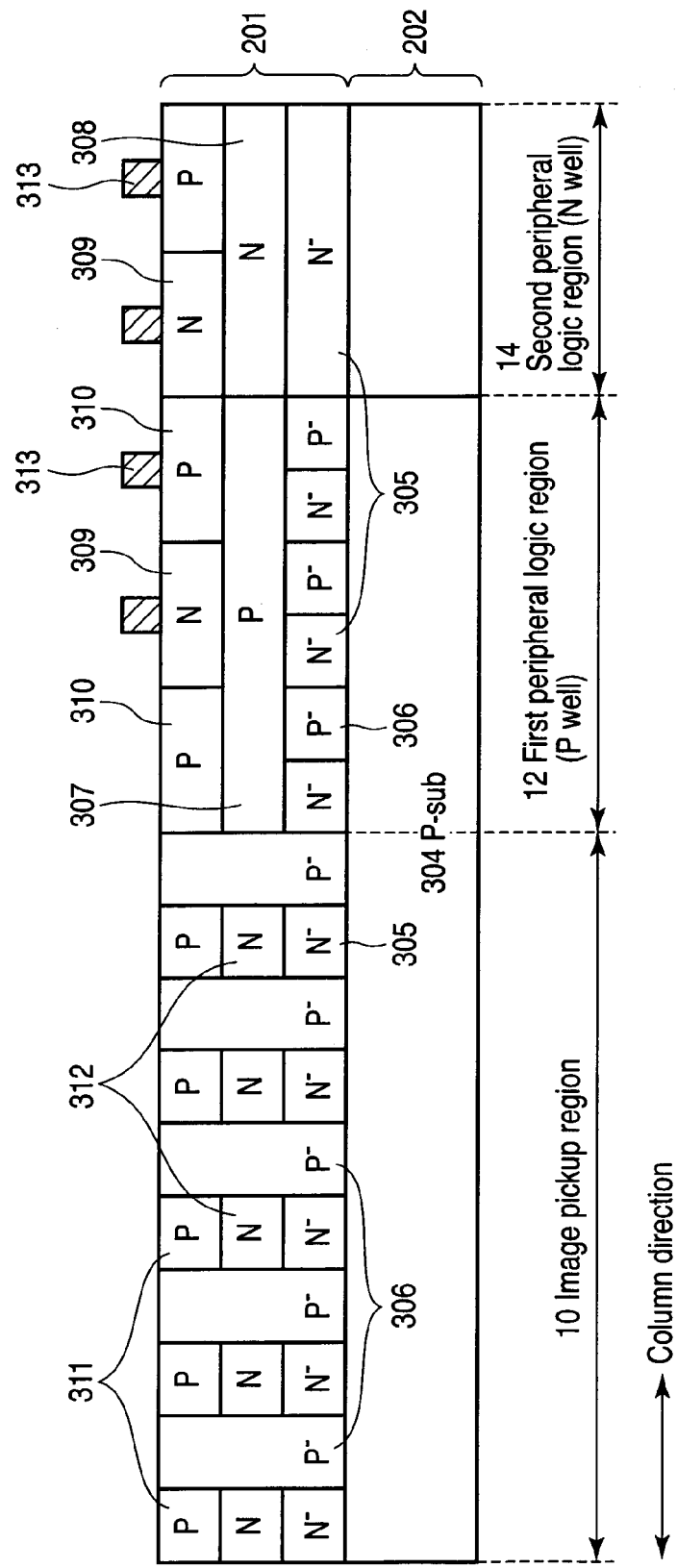
FIG. 14 is a sectional view for explaining one manufacturing step of the solid-state imaging device according to the second embodiment.

Subsequently, as shown in FIG. 14, a silicon oxide film and a polysilicon are sequentially formed on the N type diffusion layer 309 and the P type diffusion layer 310 in the first peripheral logic region 12 and the second peripheral logic region 14 to form gate electrodes 313 using a well-known manufacturing step. Subsequently, impurity is implanted using the gate electrodes 313 as masks to perform thermal diffusion, thereby forming source-drain diffusion layers (not shown) in the N type diffusion layer 309 and the P type diffusion layer 310 such that the source-drain diffusion layers are disposed so as to be separated from each other in a sandwiching manner of the gate electrode 313.

Subsequently, micro lenses and the like are formed using a well-known manufacturing step to manufacture a solid-state imaging device (an image sensor).

<Operation and Effect According to the Embodiment>

As described above, according to the solid-state imaging device and the manufacturing method thereof of the present embodiment, at least an effect similar to the above (1) can be obtained. Further, in the present embodiment, at least an effect of the following (2) can be obtained.

(2) Even if a difficulty level is high such as a large aspect ratio, the present embodiment can be easily manufactured and it is advantageous regarding improvement of reliability.

As described above, the solid-state imaging device according to the present embodiment is different from that according to the first embodiment regarding such a point that the pixel pitch PPX in the pixel region 10 and the pitch P306 of the first deep diffusion layers 306-12 arranged in the first peripheral logic region 12 are the same (PPX=P306). In other words, the diffusion layers for pixel separation 306 and the first deep diffusion layers 306-12 are arranged at the same pitch (as one example, about 1.4 μm).

With this configuration, as shown in FIG. 11, the height H1 of the photoresist 51 is, for example, in a range from about 4 to 6 μm, and the half pitch in the pixel region 10 and the first peripheral logic region 12 is, for example, about 0.7 μm. Even in a step high in difficulty level where the aspect ratio is large and it is necessary to implant impurity so as to provide a predetermined concentration gradient to the deepest position D1 of the diffusion layer region 201, the patterns in the pixel region 10 and the first peripheral logic region 12 can be made equal, so that the manufacturing step can be facilitated. Further, at the manufacturing step, no opening 54 is formed in the second peripheral logic region 14.

Thus, the number of random patterns including various patterns or pitches in a mixed manner can be reduced in the present embodiment. As a result, the separation ion implantation step within the pixel array region and the separation ion implantation step within the peripheral logic region can be made common.

Accordingly, even in the step high in difficulty level where the aspect ratio is large and it is necessary to implant impurity so as to provide a predetermined concentration gradient to the deepest position D1 of the diffusion layer region 201 like the present embodiment, the diffusion layer for pixel separation 306-10 and the first deep diffusion layer 306-12 can be formed easily, which is advantageous regarding improvement of reliability.

Incidentally, in addition to the present embodiment, for example, even if the pixel region 10 and the second peripheral logic region 14 are positioned adjacent to each other or the first and second peripheral logic regions 12 and 14 are positioned adjacent to each other, similar application of the present invention can be performed, so that the effect (2) can be obtained similarly. This is because influence in the step high in difficulty level where the aspect ratio is large and it is necessary to implant impurity so as to provide a predetermined concentration gradient to the deepest position D1 of the diffusion layer region 201 can be reduced to the second peripheral logic region 14 which does not include a random pattern (is masked).

[Third Embodiment (One Example where Connection with a Substrate is Achieved by Only a First Deep Diffusion Layer)]

Next, a solid-state imaging device and a manufacturing method thereof according to a third embodiment will be explained with reference to FIG. 15 to FIG. 20. The embodiment relates to one example where electric connection between the semiconductor substrate and the first peripheral logic region 12 in the first peripheral logic region 12 is achieved by only the first deep diffusion layer. In this explanation, detailed explanation about portions overlapping with those in the first embodiment will be omitted.

<Sectional Configuration Example>

First, a sectional configuration example of the solid-state imaging device according to the present embodiment will be explained with reference to FIG. 15.

As illustrated, the third embodiment is different from the first embodiment in a point that a first deep diffusion layer 406-12 is provided at the deepest position D1 of the diffusion layer region 201 and electric connection with the semiconductor substrate 204 is performed by only the first deep diffusion layer 406-12 in the peripheral logic region 12. In other words, the third embodiment is different from the first embodiment regarding a point that the second deep diffusion layer is not provided.

<Manufacturing Method>

Next, the manufacturing method of a solid-state imaging device according to the present embodiment will be explained with reference to FIG. 16 to FIG. 20.

Figure 16:
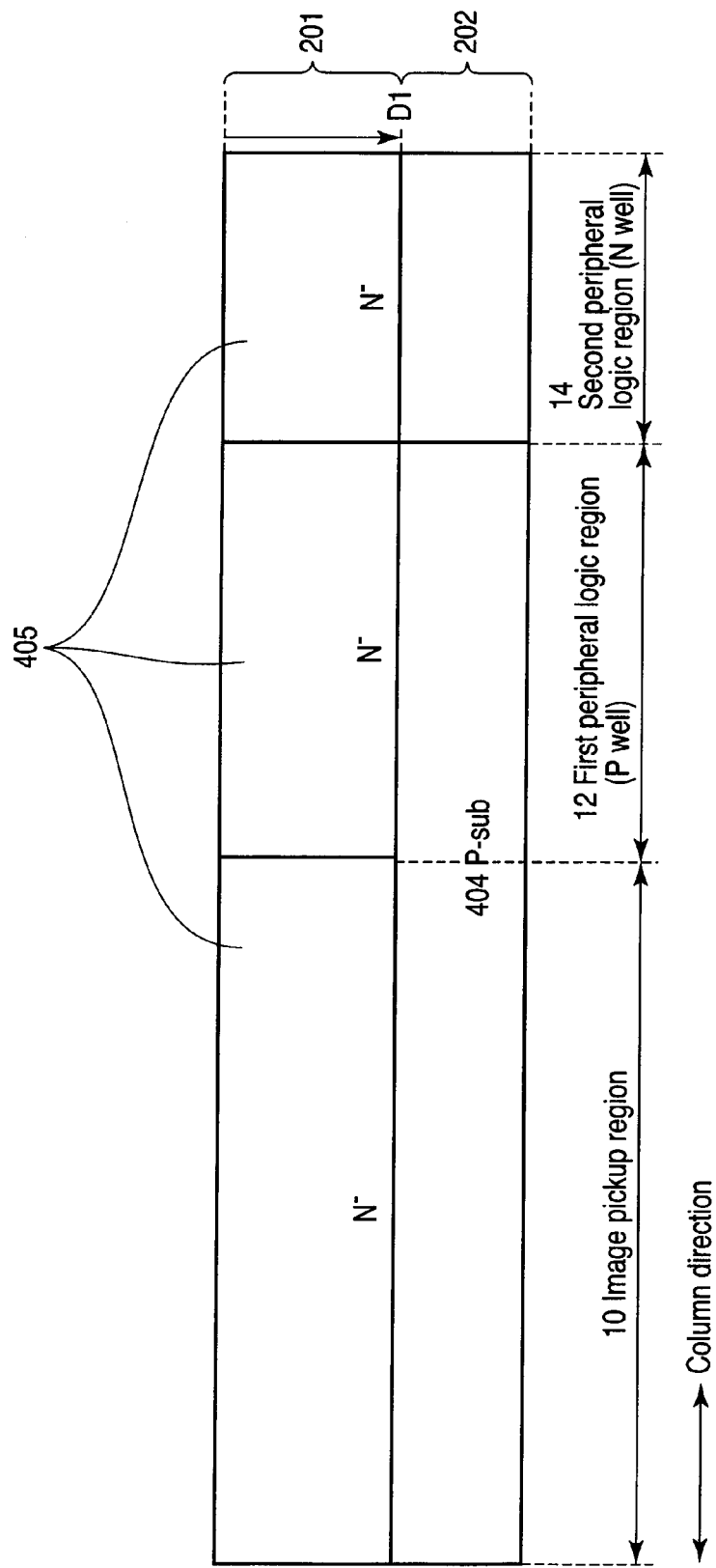
FIG. 16 is a sectional view for explaining one manufacturing step of the solid-state imaging device according to the third embodiment.

As shown in FIG. 16, first, N type impurity such as phosphorus (P) or arsenic (As) is implanted down to the deepest position D1 of the diffusion layer region 201 (in the present embodiment, up to about 2.7 μm), for example, using an epitaxial growth step to form an N⁻ type diffusion layer 405.

Figure 17:
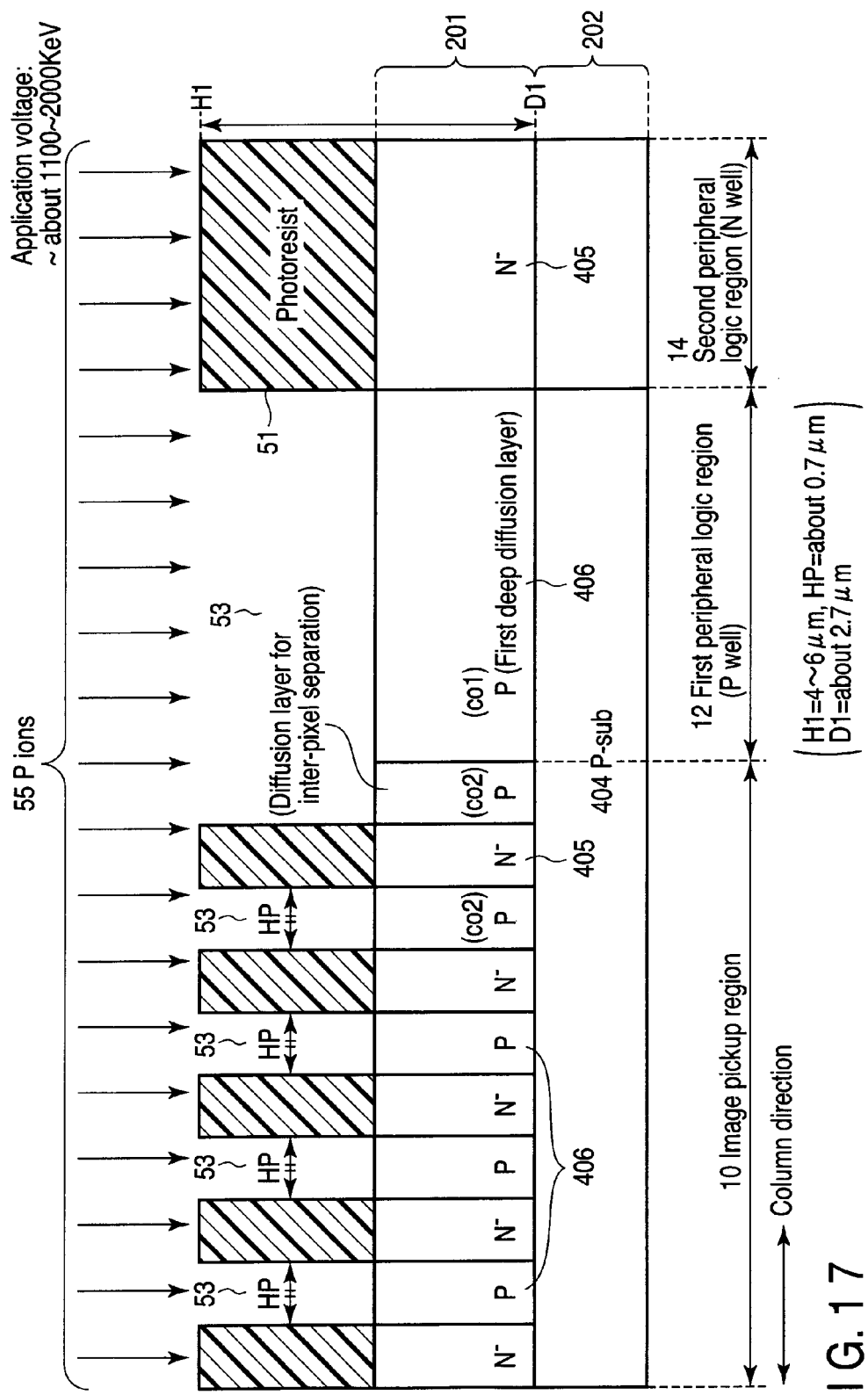
FIG. 17 is a sectional view for explaining one manufacturing step of the solid-state imaging device according to the third embodiment.

Subsequently, as shown in FIG. 17, a photoresist 51 is applied to the N⁻ type diffusion layer 405, exposure and development are applied to the photoresist 51 to form a pattern having openings 53 through which the pixel separation region of the pixel region 10 and the first peripheral logic region 12 are exposed. At this pattern forming step, the height H1 of the photoresist 51 is in a range from about 4 to 6 μm, for example, and the half pitch HP in the pixel region 10 and the first peripheral logic region 12 is about 0.7 μm, for example, like the above.

Subsequently, P type ions 55 such as boron (B) or indium (IN) are implanted down to the deepest position D1 of the diffusion layer region 201 by high energy of an application voltage V1 (in the present embodiment, about from 1100 to 2000 KeV) and by low energy of an application voltage V2 (in the present embodiment, about 300 to 800 KeV) using the photoresist 51 having the abovementioned pattern as a mask to form a diffusion layer for pixel separation 406-10 and a first deep diffusion layer (P⁻ type diffusion layer) 406-12 simultaneously. In the present embodiment, since the diffusion layer for pixel separation 406-10 and the first deep diffusion layer 406-12 can be simultaneously formed in this manner, the number of times of the high energy ion implantation step can be reduced at least from two times to one time, as compared with the comparative example described later, which is advantageous regarding reduction of manufacturing cost. Further, since the simultaneous formation can be performed, concentration gradients of the diffusion layer for pixel separation 406-10 and the first deep diffusion layer 406-12 near the deepest position D1 of the diffusion layer region 201 are formed to be equal to each other (co1=co2).

Figure 18:
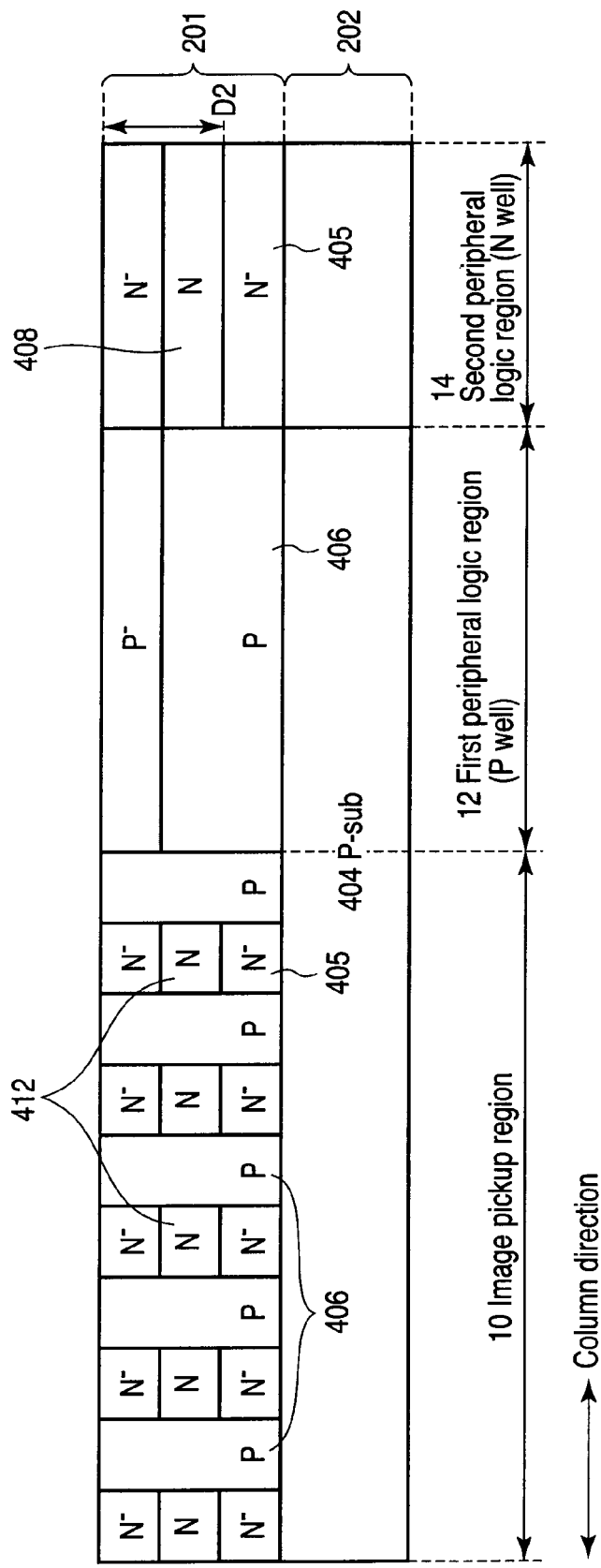
FIG. 18 is a sectional view for explaining one manufacturing step of the solid-state imaging device according to the third embodiment.

Subsequently, as shown in FIG. 18, N type diffusion layers 408 and 412 are formed down to a position D2 of the semiconductor substrate 204 in the pixel region 10 and the second peripheral logic region 14 using a manufacturing step similar to the above.

Subsequently, as shown in FIG. 19, P type diffusion layers 411 and 410 are formed down to a position near a surface of the semiconductor substrate 204 in the pixel region 10, the first peripheral logic region 12, and the second peripheral logic region 14 using a manufacturing step similar to the above. At this step, photo diodes 1-1 are formed in the pixel region 10. Subsequently, N type diffusion layers 409 are formed down a position near a surface of the semiconductor substrate 404 in the first peripheral logic region 12, and the second peripheral logic region 14 using a manufacturing step similar to the above.

Subsequently, as shown in FIG. 20, a silicon oxide film and a polysilicon are sequentially formed on the N type diffusion layer 409 and the P type diffusion layer 410 in the first peripheral logic region 12 and the second peripheral logic region 14 to form gate electrodes 413 using a well-known manufacturing step. Subsequently, impurity is implanted using the gate electrodes 413 as masks to perform thermal diffusion, thereby forming source-drain diffusion layers (not shown) in the N type diffusion layer 409 and the P type diffusion layer 410 such that the source-drain diffusion layers are disposed so as to be separated from each other in a sandwiching manner of the gate electrode 413.

Subsequently, micro lenses and the like are formed using a well-known manufacturing step to manufacture a solid-state imaging device (an image sensor).

<Effect According to the Abovementioned Embodiment>

As described above, according to the solid-state imaging device and the manufacturing method thereof, at least an effect similar to the above (1) can be obtained. Further, in the present embodiment, at least the following effect (3) can be obtained.

(3) The third embodiment is advantageous regarding reduction of manufacturing cost.

As described above, it is unnecessary to form the second deep diffusion layer in the present embodiment. Therefore, the manufacturing step of forming the second deep diffusion layer (P type diffusion layer) 307 can be eliminated by implanting P type ions such as boron (B) or indium (IN) down to the position D2 shallower than the deepest position D1 of the diffusion layer region 201 like the first or second embodiment by, for example, an application voltage (in the present embodiment, about 800 KeV) to perform overlapping implantation with the P⁻ type diffusion layer.

Therefore, since the ion implantation step for forming the second deep diffusion layer (application voltage: about 800 KeV) can be eliminated, the present embodiment is advantageous regarding reduction of manufacturing cost.

[Comparative Example (One Example where a Diffusion Layer for Pixel Separation and a First Deep Diffusion Layer are Formed Independently)]

Next, a manufacturing method of a solid-state imaging device according to a comparative example will be explained for comparison with the solid-state imaging devices and the manufacturing methods thereof according to the first to third embodiments with reference to FIG. 21 to FIG. 25. The comparative example relates to one example where a diffusion layer for pixel separation and a first deep diffusion layer are formed independently. In this explanation, detailed explanation about portions overlapping with those in the first embodiment will be omitted.

<Manufacturing Method>

A manufacturing method of a solid-state imaging device according to a comparative example will be explained with reference to FIG. 21 to FIG. 25.

Figure 21:
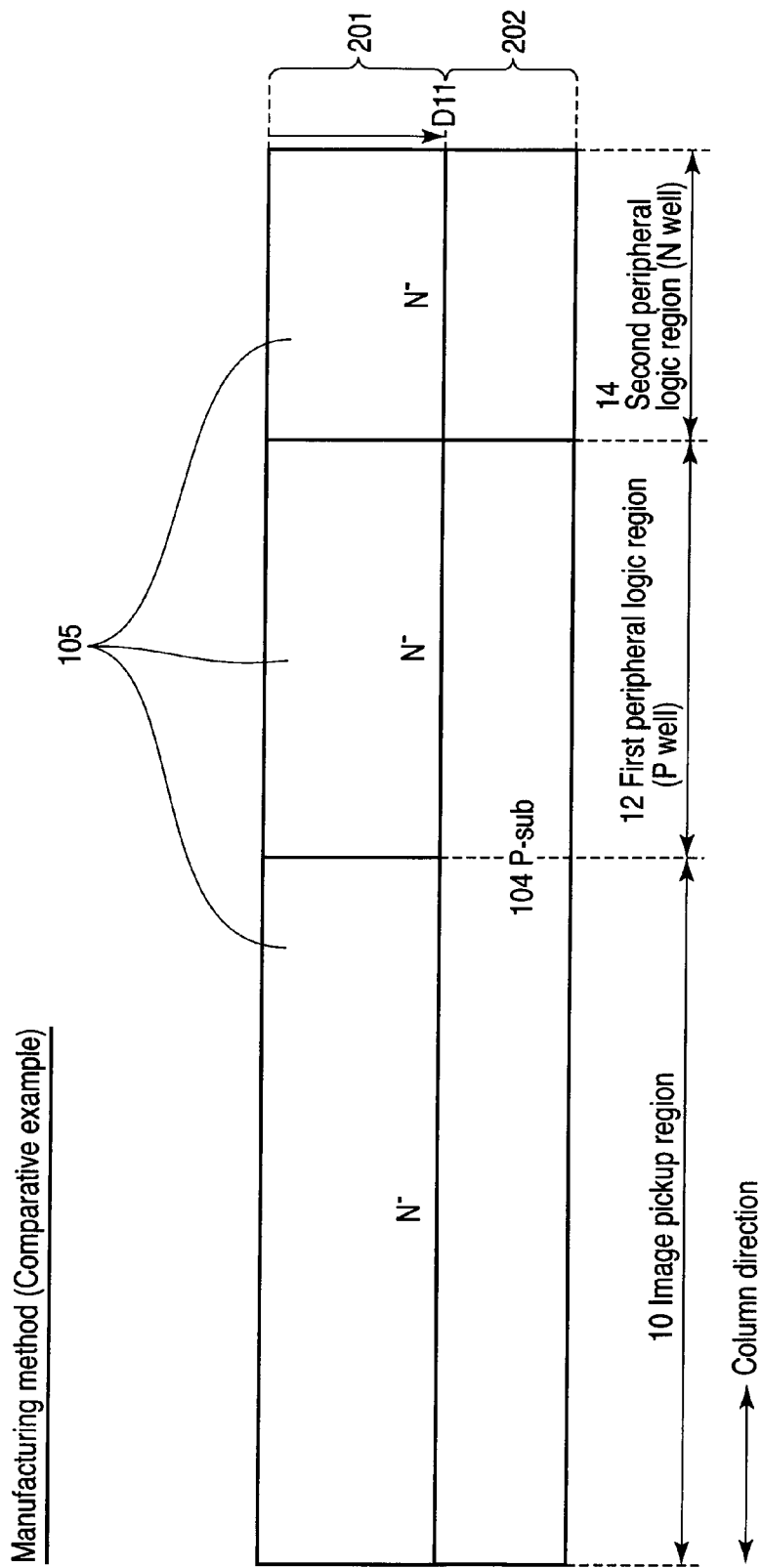
FIG. 21 a sectional view for explaining one manufacturing step of a solid-state imaging device according to a comparative example.

As shown in FIG. 21, first, N type impurity such as phosphorus (P) or arsenic (As) is implanted down to the deepest position D11 of a diffusion layer region 201 in a P type semiconductor substrate (P-sub) 104 (in the present example, down to about 2.7 μm), for example, using an epitaxial growth step to form an N⁻ type diffusion layer 105.

Subsequently, as shown in FIG. 22, a photoresist 151 is applied to the N⁻ type diffusion layer 105, exposure and development are applied to the photoresist 151 to form a pattern having openings 153 through which the pixel separation region of the pixel region 10 and the first peripheral logic region 12 are exposed. At this pattern forming step, the height H11 of the photoresist 151 is in a range from about 4 to 6 μm, for example, and the half pitch HP in the pixel region 10 and the first peripheral logic region 12 is about 0.7 μm, for example.

Subsequently, P type ions 155 such as boron (B) or indium (IN) are implanted down to the deepest position D11 of the diffusion layer 201 by high energy of an application voltage V11 (in the present example, about 1100 to 2000 KeV) and by low energy of an application voltage V12 (in the present embodiment, about 300 to 800 KeV) using the photoresist 151 having the abovementioned pattern as a mask to form a diffusion layer for pixel separation 106 independently.

Subsequently, as shown in FIG. 23, P type ions such as boron (B) or indium (IN) are implanted down to a position D22 shallower than the deepest position D11 of the diffusion layer region 201 by high energy of, for example, about 1600 KeV (about 1.6 MeV) which is an application voltage using such a mask pattern that the first peripheral logic region 12 is exposed like the above to form a first deep diffusion layer 107 independently.

Thus, the diffusion layer for pixel separation 106 and the first deep diffusion layer 107 cannot be formed simultaneously, but they are formed independently from each other in the present comparative example. Therefore, since the number of times of at least the high energy ion implantation step is increased to two times, the comparative example is disadvantageous regarding increase of manufacturing cost. Since the simultaneous forming cannot be performed, the diffusion layer for pixel separation 106 and the first deep diffusion layer 107 near the deepest position D11 of the diffusion layer region 201 are not formed so as to have the same concentration gradient (co11≠co12).

Subsequently, N type diffusion layers 108 and 112 are formed at a position shallower than the position D11 of the diffusion layer region 201 in the pixel region 10 and the second peripheral logic region 14 using a manufacturing step similar to the above.

Figure 24:
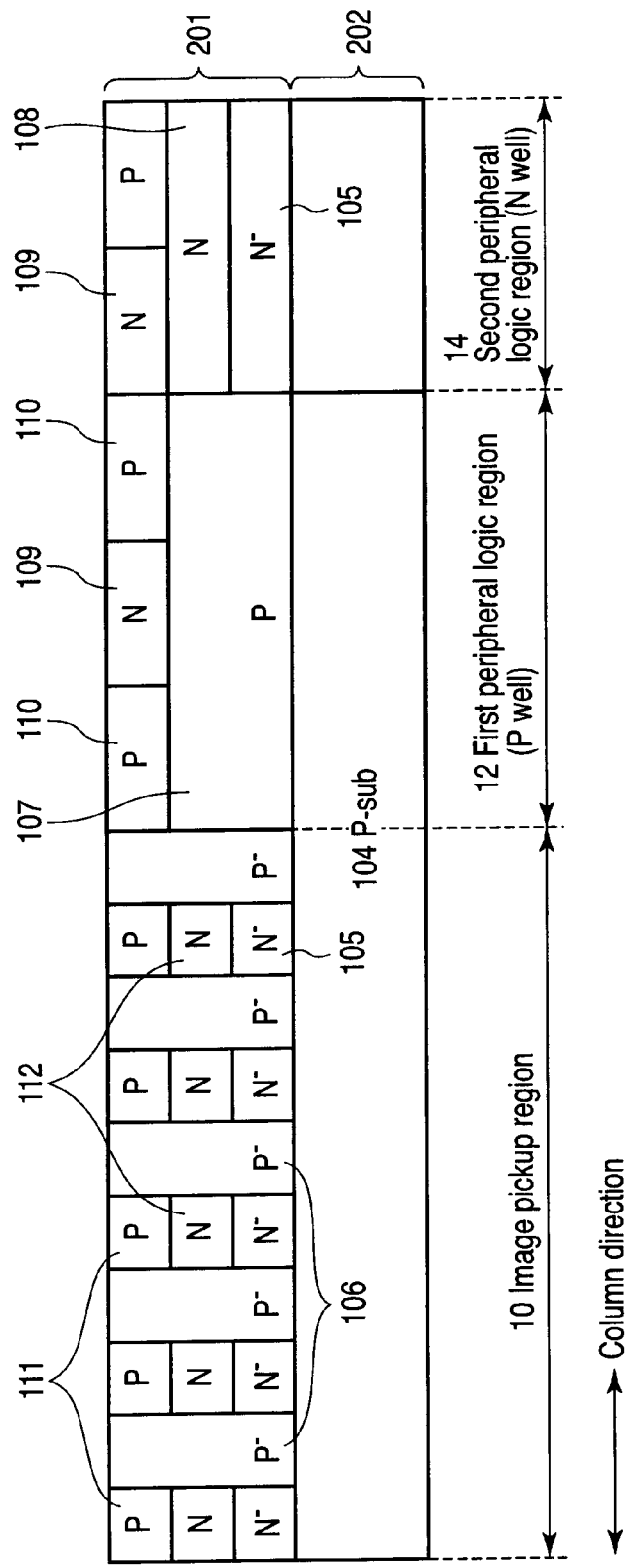
FIG. 24 is a sectional view for explaining one manufacturing step of the solid-state imaging device according to the comparative example.

Subsequently, as shown in FIG. 24, P type diffusion layers 111 and 110 are formed at a position near a surface of the semiconductor substrate 104 in the pixel region 10, the first peripheral logic region 12, and the second peripheral logic region 14 using a manufacturing step similar to the above. At this step, photodiodes are formed in the pixel region 10. Subsequently, N type diffusion layers 109 are formed at a position near a surface of the semiconductor substrate 104 in the first peripheral logic region 12, and the second peripheral logic region 14 using a manufacturing step similar to the above.

Figure 25:
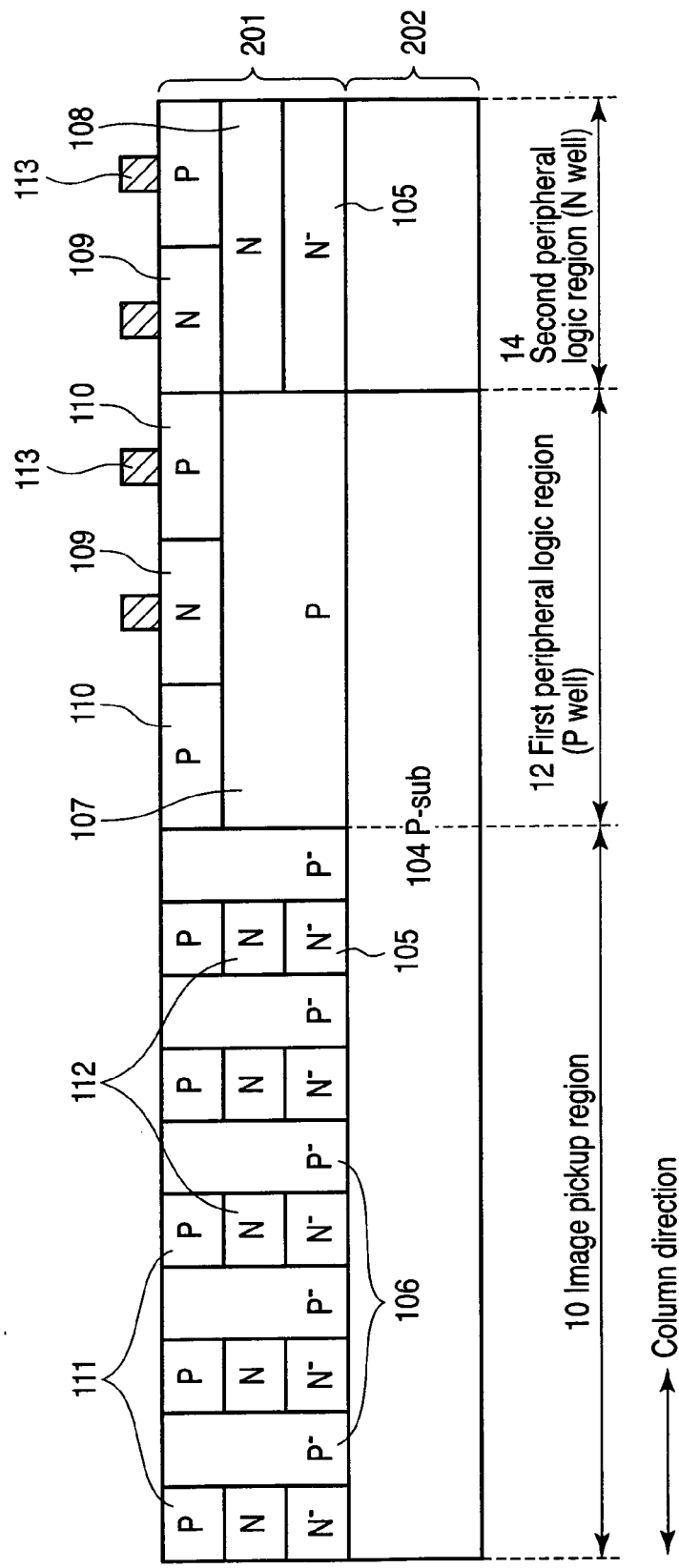
FIG. 25 is a sectional view for explaining one manufacturing step of the solid-state imaging device according to the comparative example.

Subsequently, as shown in FIG. 25, a silicon oxide film and a polysilicon are sequentially formed on the N type diffusion layer 109 and the P type diffusion layer 110 in the first peripheral logic region 12 and the second peripheral logic region 14 using a well-known manufacturing step to form gate electrodes 113. Subsequently, impurity implantation is performed and thermal diffusion is performed, thereby forming source-drain diffusion layers (not shown) in the N type diffusion layer 409 and the P type diffusion layer 110 such that they are disposed so as to be separated from each other in a sandwiching manner of the gate electrode 113.

Subsequently, micro lenses and the like are formed using a well-known manufacturing step to manufacture a solid-state imaging device (an image sensor) according to the comparative example.

As described above, in the present comparative example, the diffusion layer for pixel separation 106 and the first deep diffusion layer 107 cannot be performed simultaneously and they are formed independently from each other. Therefore, since the number of times of at least the high energy ion implantation step is increased to two times as compared with the above embodiments, the comparative example is disadvantageous regarding increase of manufacturing cost. Since the simultaneous formation cannot be performed, the concentration gradients of the diffusion layer for pixel separation 106 and the first deep diffusion layer 107 near the deepest position D11 of the diffusion layer region 201 are not formed so as to be equal to each other (co11≠co12).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a semiconductor substrate of a first conductive type having a diffusion layer region provided on a surface thereof;
   a diffusion layer of the first conductive type for a pixel separation whose bottom portion is formed at the deepest position of the diffusion layer region in a pixel region; and
   a first deep diffusion layer of the first conductive type provided at the deepest position of the diffusion layer region in a first peripheral logic region for electrically connecting the semiconductor substrate and the first peripheral logic region and having a first concentration gradient equal to that of the diffusion layer for the pixel separation.

2. The device according to claim 1, further comprising a second deep diffusion layer of the first conductive type provided on the first deep diffusion layer in the semiconductor substrate and having a second concentration gradient higher than the first concentrate gradient.

3. The device according to claim 1, wherein a pixel pitch in the pixel region is equal to a pitch of the first deep diffusion layer.

4. The device according to claim 3, further comprising a third deep diffusion layer of a second conductive type disposed at the deepest position of the diffusion layer region in the first peripheral logic region adjacent to the first deep diffusion layer.

5. The device according to claim 2, further comprising a diffusion layer of a second conductive type provided on the second deep diffusion layer and on a surface region of the semiconductor substrate.

6. The device according to claim 5, further comprising an amplifying transistor provided on the diffusion layer of the second conductive type and configuring a pixel.

7. The device according to claim 1, further comprising a reading transistor provided on the diffusion layer for the pixel separation and configuring a pixel.

8. The device according to claim 1, further comprising a photodiode PN-joined to a surface region in the pixel region and configuring a pixel.

9. The device according to claim 8, further comprising an interlayer insulating film provided so as to cover the photodiode; and
   a micro lens provided on the interlayer insulating film corresponding to the photodiode.

10. The device according to claim 1, further comprising a second peripheral logic region arranged adjacent to the first peripheral logic region.

11. A manufacturing method of a solid-state imaging device comprising:
    implanting impurity of a first conductive type into a diffusion layer region in a semiconductor substrate of the first conductive type, thereby forming a diffusion layer of the first conductive type for a pixel separation whose bottom portion is formed at the deepest position of the diffusion layer region in a pixel region and a first deep diffusion layer of the first conductive type formed for electrically connecting the semiconductor substrate formed at the deepest position of the diffusion layer region in a peripheral logic region and the peripheral logic region and having a first concentration gradient equal to that of the diffusion layer for the pixel separation.

12. The method according to claim 11, further comprising using an application voltage smaller than an application voltage when simultaneously forming the diffusion layer for the pixel separation and the first deep diffusion layer to implant impurity of the first conductive type at a position of the diffusion layer region shallower than the first deep diffusion layer in an overlapping manner with the first deep diffusion layer, thereby forming a second deep diffusion layer of the first conductive type having a second concentration gradient higher than the first concentration gradient.

13. The method according to claim 11, wherein a pixel pitch in the pixel region is equal to a pitch of the first deep diffusion layer.

14. The method according to claim 11, further comprising forming a third deep diffusion layer of a second conductive type at the deepest position of the diffusion layer region in a first peripheral logic region so as to be positioned adjacent to the first deep diffusion layer.

15. The method according to claim 12, further comprising forming a diffusion layer of a second conductive type on the second deep diffusion layer and a surface region of the semiconductor substrate.

16. The method according to claim 15, further comprising forming an amplifying transistor on the diffusion layer of the second conductive type, the amplifying transistor configuring a pixel.

17. The method according to claim 11, further comprising forming a read transistor on the diffusion layer for the pixel separation, the read transistor configuring a pixel.

18. The method according to claim 11, further comprising forming a photodiode PN-joined to a surface region in the pixel region, the photodiode configuring a pixel.

19. The method according to claim 18, further comprising forming an interlayer insulating film so as to cover the photodiode; and forming a micro lens on the interlayer insulating film corresponding to the photodiode.

20. The method according to claim 12, wherein the diffusion layer for the pixel separation and the first deep diffusion layer are formed by high energy ion implantation; and the second deep diffusion layer is formed by high energy ion implantation.

* * * * *